(12) United States Patent
Gregg et al.

(10) Patent No.: US 9,469,898 B2
(45) Date of Patent: Oct. 18, 2016

(54) METHOD AND APPARATUS TO HELP PROMOTE CONTACT OF GAS WITH VAPORIZED MATERIAL

(71) Applicant: Entegris, Inc., Billerica, MA (US)

(72) Inventors: John N. Gregg, Marble Falls, TX (US); Scott L. Battle, Cedar Park, TX (US); Jeffrey I. Banton, Burnet, TX (US); Donn K. Naito, Marble Falls, TX (US); Ravi K. Laxman, San Jose, CA (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 14/815,805

(22) Filed: Jul. 31, 2015

(65) Prior Publication Data

US 2015/0337436 A1 Nov. 26, 2015

Related U.S. Application Data

(60) Continuation of application No. 14/686,274, filed on Apr. 14, 2015, which is a continuation of application No. 13/862,412, filed on Apr. 13, 2013, now Pat. No. 9,004,462, which is a continuation of application No.

(Continued)

(51) Int. Cl.
*C23C 16/00* (2006.01)
*C23C 16/448* (2006.01)
(Continued)

(52) U.S. Cl.
CPC ....... *C23C 16/4483* (2013.01); *C23C 16/4481* (2013.01); *F17C 3/00* (2013.01);
(Continued)

(58) Field of Classification Search
CPC . C23C 16/4481; C23C 16/4483; F17C 3/00; F17C 3/02; F17C 11/00; F17C 2203/03; Y02E 60/321; Y10S 261/65
USPC ........ 261/142, 121.1, 124, DIG. 65; 118/726
See application file for complete search history.

(56) References Cited

U.S. PATENT DOCUMENTS 2,447,789 A 8/1948 Barr
2,721,064 A 10/1955 Reichardt
(Continued)

FOREIGN PATENT DOCUMENTS

CN 1452507 A 10/2003
DE 3931189 A1 3/1991
(Continued)

OTHER PUBLICATIONS

Boomsma, K., et al., "Metal foams as compact high performance heat exchangers", "Mechanics of Materials", Dec. 2003, pp. 1161-1176, vol. 35, No. 12.
(Continued)

*Primary Examiner* — Charles Bushey

(57) ABSTRACT

Vaporizable material is supported within a vessel to promote contact of an introduced gas with the vaporizable material, and produce a product gas including vaporized material. A heating element supplies heat to a wall of the vessel to heat vaporizable material disposed therein. The vessel may comprise an ampoule having a removable top. Multiple containers defining multiple material support surfaces may be stacked disposed within a vessel in thermal communication with the vessel. A tube may be disposed within the vessel and coupled to a gas inlet. Filters, flow meters, and level sensors may be further provided. Product gas resulting from contact of introduced gas with vaporized material may be delivered to atomic layer deposition (ALD) or similar process equipment. At least a portion of source material including a solid may be dissolved in a solvent, followed by removal of solvent to yield source material (e.g., a metal complex) disposed within the vaporizer.

31 Claims, 6 Drawing Sheets

Related U.S. Application Data

13/398,814, filed on Feb. 16, 2012, now Pat. No. 8,444,120, which is a continuation of application No. 12/940,969, filed on Nov. 5, 2010, now Pat. No. 8,128,073, which is a division of application No. 12/358,723, filed on Jan. 23, 2009, now Pat. No. 7,828,274, which is a continuation of application No. 11/930,031, filed on Oct. 30, 2007, now Pat. No. 7,487,956, which is a continuation of application No. 10/858,509, filed on Jun. 1, 2004, now Pat. No. 7,300,038, which is a continuation-in-part of application No. 10/201,518, filed on Jul. 23, 2002, now Pat. No. 6,921,062, said application No. 12/358,723 is a continuation of application No. 11/846,394, filed on Aug. 28, 2007, now Pat. No. 7,556,244, which is a division of application No. 10/858,509, filed on Jun. 1, 2004, now Pat. No. 7,300,038, which is a continuation-in-part of application No. 10/201,518, filed on Jul. 23, 2002, now Pat. No. 6,921,062.

(51) Int. Cl.
   *F17C 3/00* (2006.01)
   *F17C 3/02* (2006.01)
   *F17C 11/00* (2006.01)

(52) U.S. Cl.
   CPC ............... *F17C 3/02* (2013.01); *F17C 11/00* (2013.01); *F17C 2203/03* (2013.01); *Y02E 60/321* (2013.01); *Y10S 261/65* (2013.01)

(56) References Cited

U.S. PATENT DOCUMENTS

| | | |
|---|---|---|
| 2,769,624 A | 11/1956 | Burnside |
| 2,902,574 A | 9/1959 | Gudmundsen et al. |
| 3,405,251 A | 10/1968 | Spriggs et al. |
| 3,647,197 A | 3/1972 | Holloway |
| 3,740,043 A | 6/1973 | Reed et al. |
| 3,834,682 A | 9/1974 | McPhee |
| 3,920,882 A | 11/1975 | Venkatu |
| 4,105,821 A | 8/1978 | Blaich et al. |
| 4,190,965 A | 3/1980 | Erickson |
| 4,916,828 A | 4/1990 | Yamane et al. |
| 5,020,476 A | 6/1991 | Bay et al. |
| 5,078,976 A | 1/1992 | Shibauchi et al. |
| 5,104,695 A | 4/1992 | Greer et al. |
| 5,336,324 A | 8/1994 | Stall et al. |
| 5,377,429 A | 1/1995 | Sandhu |
| 5,476,547 A | 12/1995 | Mikoshiba et al. |
| 5,536,323 A | 7/1996 | Kirlin et al. |
| 5,553,188 A | 9/1996 | Ewing |
| 5,553,395 A | 9/1996 | Wen et al. |
| 5,603,169 A | 2/1997 | Kim |
| 5,711,354 A | 1/1998 | Siegele et al. |
| 5,722,184 A | 3/1998 | Onoe et al. |
| 5,764,849 A | 6/1998 | Atwell |
| 5,904,771 A | 5/1999 | Tasaki et al. |
| 5,917,140 A | 6/1999 | Tom |
| 6,020,511 A | 2/2000 | Vaartstra et al. |
| 6,039,808 A | 3/2000 | Toyoda et al. |
| 6,046,345 A | 4/2000 | Kadokura et al. |
| 6,107,634 A | 8/2000 | Horsky |
| 6,126,996 A | 10/2000 | Kirlin et al. |
| 6,136,725 A | 10/2000 | Loan et al. |
| 6,143,191 A | 11/2000 | Baum et al. |
| 6,149,975 A | 11/2000 | Tasaki et al. |
| 6,202,591 B1 | 3/2001 | Witzman et al. |
| 6,210,485 B1 | 4/2001 | Zhao et al. |
| 6,237,529 B1 | 5/2001 | Spahn |
| 6,254,792 B1 | 7/2001 | Van Buskirk et al. |
| 6,270,839 B1 | 8/2001 | Onoe et al. |
| 6,281,124 B1 | 8/2001 | Vaartstra |
| 6,288,403 B1 | 9/2001 | Horsky et al. |
| 6,359,159 B1 | 3/2002 | Welch et al. |
| 6,409,839 B1 | 6/2002 | Sun et al. |
| 6,413,476 B1 | 7/2002 | Barnhart |
| 6,431,118 B1 | 8/2002 | Woltmann |
| 6,443,435 B1 | 9/2002 | Hendrickson |
| 6,470,144 B1 | 10/2002 | Tarutani et al. |
| 6,473,564 B1 | 10/2002 | Nagashima et al. |
| 6,548,683 B1 | 4/2003 | Vaartstra |
| 6,581,915 B2 | 6/2003 | Bartsch et al. |
| 6,607,785 B2 | 8/2003 | Timmons et al. |
| 6,616,766 B2 | 9/2003 | Dunham |
| 6,620,225 B2 | 9/2003 | Wang et al. |
| 6,620,256 B1 | 9/2003 | Arno et al. |
| 6,701,066 B2 | 3/2004 | Sandhu |
| 6,718,126 B2 | 4/2004 | Lei |
| 6,779,378 B2 | 8/2004 | Bondestam |
| 6,797,337 B2 | 9/2004 | Dando et al. |
| 6,828,256 B2 | 12/2004 | Vaartstra |
| 6,837,939 B1 | 1/2005 | Klug et al. |
| 6,841,141 B2 | 1/2005 | Arno et al. |
| 6,863,021 B2 | 3/2005 | Sneh |
| 6,887,337 B2 | 5/2005 | Lebouitz et al. |
| 6,905,541 B2 | 6/2005 | Chen et al. |
| 6,909,839 B2 | 6/2005 | Wang et al. |
| 6,915,592 B2 | 7/2005 | Guenther |
| 6,921,062 B2 | 7/2005 | Gregg et al. |
| 6,991,671 B2 | 1/2006 | Brestovansky et al. |
| 7,018,940 B2 | 3/2006 | Dunham |
| 7,048,785 B2 | 5/2006 | Wang et al. |
| 7,109,113 B2 | 9/2006 | Derderian |
| 7,122,085 B2 | 10/2006 | Shero et al. |
| 7,128,785 B2 | 10/2006 | Kaeppeler et al. |
| 7,186,385 B2 | 3/2007 | Ganguli et al. |
| 7,261,118 B2 | 8/2007 | Birtcher et al. |
| 7,300,038 B2 | 11/2007 | Gregg et al. |
| 7,413,767 B2 | 8/2008 | Bauch et al. |
| 7,484,315 B2 | 2/2009 | Suzuki et al. |
| 7,485,338 B2 | 2/2009 | Faguet |
| 7,487,956 B2 | 2/2009 | Gregg et al. |
| 7,488,512 B2 | 2/2009 | Suzuki et al. |
| 7,524,374 B2 | 4/2009 | Chen et al. |
| 7,556,244 B2 | 7/2009 | Gregg et al. |
| 7,638,002 B2 | 12/2009 | Suzuki et al. |
| 7,651,570 B2 | 1/2010 | Brcka |
| 7,708,835 B2 | 5/2010 | Suzuki et al. |
| 7,828,274 B2 | 11/2010 | Gregg et al. |
| 7,846,256 B2 | 12/2010 | Suzuki |
| 8,128,073 B2 | 3/2012 | Gregg et al. |
| 8,146,896 B2 | 4/2012 | Cuvalci et al. |
| 8,444,120 B2 | 5/2013 | Gregg et al. |
| 8,708,320 B2 | 4/2014 | Steidl et al. |
| 9,004,462 B2 | 4/2015 | Gregg et al. |
| 9,034,105 B2 * | 5/2015 | Chaubey ............ C23C 16/4481 118/726 |
| 2001/0003603 A1 | 6/2001 | Eguchi et al. |
| 2001/0008121 A1 | 7/2001 | Tanabe et al. |
| 2002/0145210 A1 | 10/2002 | Tompkins et al. |
| 2002/0192370 A1 | 12/2002 | Metzner et al. |
| 2003/0053799 A1 | 3/2003 | Lei |
| 2003/0054099 A1 | 3/2003 | Jurgensen et al. |
| 2003/0101938 A1 | 6/2003 | Ronsse et al. |
| 2003/0111014 A1 | 6/2003 | Donatucci et al. |
| 2003/0116019 A1 | 6/2003 | Torkaman |
| 2003/0119312 A1 | 6/2003 | Vaartstra |
| 2003/0121608 A1 | 7/2003 | Chen et al. |
| 2003/0232138 A1 | 12/2003 | Tuominen et al. |
| 2004/0013558 A1 | 1/2004 | Kondoh et al. |
| 2004/0083787 A1 | 5/2004 | Bondestam |
| 2004/0165870 A1 | 8/2004 | Sandhu |
| 2005/0000427 A1 | 1/2005 | Lee et al. |
| 2005/0006799 A1 | 1/2005 | Gregg et al. |
| 2005/0072357 A1 | 4/2005 | Shero et al. |
| 2005/0230046 A1 | 10/2005 | Lebouitz et al. |
| 2006/0024439 A2 | 2/2006 | Tuominen et al. |
| 2006/0030163 A1 | 2/2006 | Vaartstra |
| 2006/0037540 A1 | 2/2006 | Woelk et al. |
| 2006/0121198 A1 | 6/2006 | Shenai-Khatkhate et al. |
| 2006/0185597 A1 | 8/2006 | Suzuki et al. |

(56) References Cited

U.S. PATENT DOCUMENTS

| | | |
|---|---|---|
| 2007/0042119 A1 | 2/2007 | Matthysse et al. |
| 2007/0194470 A1 | 8/2007 | Dedontney |
| 2007/0266949 A1 | 11/2007 | Shenai-Khatkhate |
| 2008/0085226 A1 | 4/2008 | Fondurulia et al. |
| 2008/0092816 A1 | 4/2008 | Birtcher et al. |
| 2008/0191153 A1 | 8/2008 | Marganski et al. |
| 2008/0199975 A1 | 8/2008 | Park et al. |
| 2009/0107401 A1 | 4/2009 | Reinhold et al. |
| 2009/0181168 A1 | 7/2009 | Chaubey et al. |
| 2010/0255198 A1 | 10/2010 | Cleary et al. |
| 2010/0322604 A1 | 12/2010 | Fondurulia et al. |
| 2013/0228476 A1 | 9/2013 | Gregg et al. |
| 2014/0329025 A1 | 11/2014 | Cleary et al. |

FOREIGN PATENT DOCUMENTS

| | | |
|---|---|---|
| DE | 19638100 C1 | 3/1998 |
| EP | 0714999 A1 | 6/1996 |
| EP | 1508631 A1 | 2/2005 |
| EP | 1669474 A1 | 6/2006 |
| GB | 1559978 A | 1/1980 |
| JP | 55-160424 A | 12/1980 |
| JP | 58-126973 A | 7/1983 |
| JP | 6070176 A | 4/1985 |
| JP | 2-107593 A | 4/1990 |
| JP | 314166 U | 2/1991 |
| JP | 3-72387 A | 3/1991 |
| JP | 4-36469 A | 2/1992 |
| JP | 4-228562 A | 8/1992 |
| JP | 4-292406 A | 10/1992 |
| JP | 4-333572 A | 11/1992 |
| JP | 5-19351 A | 1/1993 |
| JP | 5-98445 A | 4/1993 |
| JP | 5214537 A | 8/1993 |
| JP | 8-279497 A | 10/1996 |
| JP | 11-278997 A | 10/1999 |
| JP | 11302286 A | 11/1999 |
| JP | 2000104172 A | 4/2000 |
| JP | 2000192243 A | 7/2000 |
| JP | 2000239843 A | 9/2000 |
| JP | 2001-59161 A | 3/2001 |
| JP | 2001-59178 A | 3/2001 |
| JP | 2001517267 A | 10/2001 |
| JP | 2002-270523 A | 9/2002 |
| JP | 2004100035 A | 4/2004 |
| JP | 2006503178 A | 1/2006 |
| KR | 10-2005-0030963 A | 3/2005 |
| KR | 10-2006-0064556 A | 6/2006 |
| WO | 9312266 A1 | 6/1993 |
| WO | 9421840 A1 | 9/1994 |
| WO | 9641035 A1 | 12/1996 |
| WO | 9904061 A1 | 1/1999 |
| WO | 0065127 A1 | 11/2000 |
| WO | 0161071 A2 | 8/2001 |
| WO | 0183084 A1 | 11/2001 |
| WO | 03004723 A1 | 1/2003 |
| WO | 2004010463 A2 | 1/2004 |
| WO | 2004011695 A2 | 2/2004 |
| WO | 2006009872 A1 | 1/2006 |
| WO | 2006101767 A2 | 9/2006 |
| WO | 2008028170 A2 | 3/2008 |
| WO | 2008045972 A2 | 4/2008 |

OTHER PUBLICATIONS

Palko, A., et al., "The Vapor Pressures of Zirconium Tetrachloride and Hafnium Tetrachloride", "J. Phys. Chem.", Mar. 1958, pp. 319-322, vol. 62.

Co-pending unpublished U.S. Appl. No. 14/686,274, filed Apr. 14, 2015.

* cited by examiner

METHOD AND APPARATUS TO HELP PROMOTE CONTACT OF GAS WITH VAPORIZED MATERIAL

CROSS REFERENCE TO RELATED APPLICATIONS

This is a continuation under 35 U.S.C. §120 of U.S. patent application Ser. No. 14/686,274 filed Apr. 14, 2015, which is a continuation under 35 U.S.C. §120 of U.S. patent application Ser. No. 13/862,412 filed Apr. 13, 2013, and subsequently issued Apr. 14, 2015 as U.S. Pat. No. 9,004,462, which is a continuation under 35 U.S.C. §120 of U.S. patent application Ser. No. 13/398,814 filed Feb. 16, 2012, and subsequently issued May 21, 2013 as U.S. Pat. No. 8,444,120, which is a continuation under 35 U.S.C. §120 of U.S. patent application Ser. No. 12/940,969 filed Nov. 5, 2010 and subsequently issued as U.S. Pat. No. 8,128,073, which in turn is a divisional under 35 U.S.C. §120 of U.S. patent application Ser. No. 12/358,723 filed Jan. 23, 2009 and subsequently issued as U.S. Pat. No. 7,828,274, which in turn is a continuation under 35 U.S.C. §120 of U.S. patent application Ser. No. 11/930,031, filed on Oct. 30, 2007 and subsequently issued as U.S. Pat. No. 7,487,956, which is a continuation under 35 U.S.C. §120 of U.S. patent application Ser. No. 10/858,509, filed on Jun. 1, 2004, and subsequently issued as U.S. Pat. No. 7,300,038, which is a continuation-in-part under 35 U.S.C. §120 of U.S. patent application Ser. No. 10/201,518, filed on Jul. 23, 2002 and subsequently issued as U.S. Pat. No. 6,921,062. U.S. patent application Ser. No. 12/358,723 filed Jan. 23, 2009 is also a continuation under 35 U.S.C. §120 of U.S. patent application Ser. No. 11/846,394 filed on Aug. 28, 2007 and subsequently issued as U.S. Pat. No. 7,556,244, which is a divisional under 35 U.S.C. §120 of U.S. patent application Ser. No. 10/858,509, filed on Jun. 1, 2004, and subsequently issued as U.S. Pat. No. 7,300,038, which is a continuation-in-part under 35 U.S.C. §120 of U.S. patent application Ser. No. 10/201,518, filed on Jul. 23, 2002 and subsequently issued as U.S. Pat. No. 6,921,062. The disclosures of the foregoing applications and patents are hereby incorporated herein in their respective entireties, for all purposes, and the priority of all such applications is hereby claimed under the provisions of 35 U.S.C. §120.

FIELD

One or more embodiments described in this patent application relate to the field of vaporizers.

BACKGROUND ART

A vaporizer may be used, for example, to deliver material in a carrier gas to a process chamber of semiconductor processing equipment such as, for example, chemical vapor deposition (CVD) equipment to form a film over a workpiece or an ion implanter to accelerate ions toward a workpiece for injection into the workpiece.

One vaporizer called a bubbler delivers vapor from material in a liquid state to a process chamber by heating the liquid material in a container and introducing a carrier gas at a controlled rate into the liquid material near the bottom of the container. The carrier gas then becomes saturated with vapor from the liquid material as the carrier gas bubbles to the top of the container. The saturated carrier gas is then transported to the process chamber.

Vapor from material in a solid state may be delivered to a process chamber by heating the material to its sublimation temperature and directing the flow of a carrier gas past the heated material.

SUMMARY

In one aspect, the invention relates to a method utilizing a vaporizer including at least one wall defining an internal compartment, the method comprising: dissolving a solid source material in a solvent; and removing said solvent to yield a metal complex, wherein the metal complex is disposed within the internal compartment of the vaporizer.

In another aspect, the invention relates to a method utilizing a plurality of containers, wherein each container of the plurality of containers defines a cavity therein, the method including: introducing source material comprising a solid into the cavity of each container of the plurality of containers; dissolving at least a portion of the source material in a solvent; removing said solvent from said source material; and stacking said plurality of containers in a vaporizer ampoule.

In another aspect, the invention relates to a vapor delivery system including: a plurality of containers, wherein each container of the plurality of containers defines therein a cavity, and the cavity of each container contains a solid source material and a solvent; and a vaporizer ampoule adapted to receive said plurality of containers.

In another aspect, the invention relates to a vaporizer including: at least one wall defining an internal compartment; and a solid source material disposed within the internal compartment, the solid source material comprising a metal complex processed by dissolution in a solvent followed by removal of the solvent under reduced pressure.

In another aspect, the invention relates to a vaporizer comprising a vessel having (i) a thermally conductive vessel wall enclosing an interior volume, (ii) a gas inlet adapted to supply gas to the interior volume, (iii) a gas outlet adapted to receive gas carrying vaporized material from the interior volume, and (iv) a plurality of solid material holders disposed at different levels within the vessel, wherein each solid material holder has a solid material support surface and a thermally conductive holder sidewall adapted to be in substantial thermal contact with the vessel wall at a vessel operating temperature, and is adapted to hold a solid vaporizable material having a solid form comprising any of particles, agglomerated particles, powders, crystalline material, loose material, and discontinuous material, and wherein the vessel is adapted to transfer heat through the vessel wall to the thermally conductive holder sidewall.

In another aspect, the invention relates to a method utilizing vaporizer apparatus comprising a vessel having (i) a thermally conductive vessel wall enclosing an interior volume, (ii) a gas inlet adapted to supply gas to the interior volume, (iii) a gas outlet adapted to receive gas carrying vaporized material from the interior volume, and (iv) a plurality of solid material holders disposed at different levels within the vessel, wherein each solid material holder has a solid material support surface and a thermally conductive holder sidewall in contact with the vessel wall, and contains a solid vaporizable material having a solid form comprising any of particles, agglomerated particles, powders, crystalline material, loose material, and discontinuous material, the method comprising: (a) heating the vessel to vaporize at least a portion of the vaporizable material; (b) introducing a first gas to the vessel via the gas inlet to contact the vaporizable material and produce a second gas comprising vaporized material; and (c) delivering the second gas comprising vaporized material to process equipment via the gas outlet.

In a further aspect, the invention relates to a vapor delivery vessel for vaporizing and delivering vaporized source material, the vessel comprising: a peripheral vessel wall bounding an interior volume; a gas inlet and a gas outlet arranged in at least intermittent fluid communication with the interior volume, the gas inlet being adapted to supply a first gas to the interior volume; and at least one support surface disposed within the interior volume and adapted to support vaporizable source material in or along a flow path of said first gas within the interior volume; characterized by at least one of the following: (a) the vessel wall is formed of any of a polymeric material, a ceramic material, a composite material, layered materials, and lined materials; (b) the support surface is defined by a support structure disposed within the interior volume, wherein the support structure and the peripheral vessel wall are formed of materials having different coefficients of thermal expansion, and are sized and shaped to be in substantial thermal contact with one another at a vessel operating temperature; (c) the interior volume includes at least one gas-permeable bag supported by the at least one support surface and containing said vaporizable source material; (d) the at least one support surface comprises a porous or aperture-defining element, and is adapted to receive vaporizable material supplied by pouring; (e) the at least one support surface is defined by a plurality of different support structures adapted for placement at different levels within the interior volume, wherein each support structure has a sidewall, and at least two support structures of said plurality of support structures have different sidewall heights; (f) the at least one support surface is defined by a plurality of different support structures adapted for placement at different levels within the interior volume, wherein at least two support structures of said plurality of support structures have supported thereon substantially different amounts of vaporizable source material; (g) the at least one support surface is partitioned with walls into a plurality of discrete support surface portions; (h) the vessel wall comprises a sight glass permitting observation or transmission of radiation to permit identification of a condition when any suitable region within the interior volume is empty or nearly empty of vaporizable source material; (i) the vessel has an associated level sensor adapted to permit identification of a condition when any suitable region within the interior volume is empty or nearly empty of vaporizable source material; and (j) the vessel has an associated purge element and at least one bypass passage, bypass inlet, or bypass outlet adapted to permit solid deposits or contaminants to be purged from the vessel or any conduit in fluid communication therewith.

At least one disclosed apparatus comprises a container and structure to help support material in the container with an increased exposed surface area to help promote contact of a gas with vaporized material. The structure for at least one disclosed apparatus may help support material for vaporization in the same form as when the material is placed at the structure.

At least one disclosed apparatus comprises a container and structure to help support material in the container with an increased exposed surface area to help promote contact of a gas with vaporized material for delivery to atomic layer deposition (ALD) process equipment.

At least one disclosed apparatus comprises a container and structure to help support liquid material in the container with an increased exposed surface area to help promote contact of a gas with vaporized liquid material.

At least one disclosed apparatus comprises a container and one or more holders that define a support surface to help support material in the container with an increased exposed surface area to help promote contact of a gas with vaporized material. A holder for at least one disclosed apparatus may have one or more sidewalls along at least a portion of a perimeter of an opening through the support surface of the holder to help define a passageway through which gas may flow through the holder.

At least one disclosed apparatus comprises a container and one or more holders that define a support surface to help support material in the container with an increased exposed surface area to help promote contact of a gas with vaporized material. A holder for at least one disclosed apparatus may have one or more walls and one or more passageways within one or more walls to allow gas to flow through the holder.

At least one disclosed apparatus comprises a container and one or more holders that define a support surface to help support material in the container with an increased exposed surface area to help promote contact of a gas with vaporized material. A holder for at least one disclosed apparatus may define a support surface at least a portion of which is over at least partially permeable material through which gas may flow.

At least one disclosed method comprises heating a container to help vaporize material in the container, introducing gas into the container, and delivering gas resulting from contact of introduced gas with vaporized material to process equipment. The container for at least one disclosed method may have structure to help support material in the container with an increased exposed surface area to help promote contact of a gas with vaporized material. The structure for at least one disclosed method may help support material for vaporization in the same form as when the material is placed at the structure.

At least one disclosed method comprises heating a container to help vaporize material in the container, introducing gas into the container, delivering gas resulting from contact of introduced gas with vaporized material to atomic layer deposition process equipment, and performing an atomic layer deposition process using the delivered gas. The container for at least one disclosed method may have structure to help support material in the container with an increased exposed surface area to help promote contact of a gas with vaporized material.

In another aspect, any of the foregoing aspects and/or other features as disclosed herein may be combined for additional advantage.

Other aspects, features and embodiments of the invention will be more fully apparent from the ensuing disclosure and appended claims.

BRIEF DESCRIPTION OF THE DRAWINGS

One or more embodiments are illustrated by way of example and not limitation in the figures of the accompanying drawings, in which like references indicate similar elements and in which.

DETAILED DESCRIPTION

Figure 1:
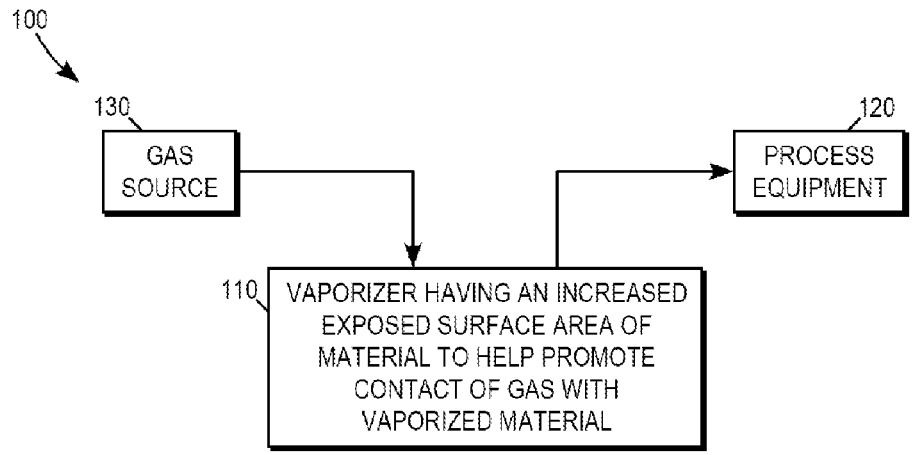
FIG. 1 illustrates, for one or more embodiments, a system using a vaporizer that helps promote contact of a gas with vaporized material.

FIG. 1 illustrates, for one or more embodiments, a system 100 that delivers a desired gas from a vaporizer 110 to process equipment 120 coupled to vaporizer 110. Vaporizer 110 vaporizes material, receives a gas from a gas source 130 coupled to vaporizer 110, and helps deliver to process equipment 120 gas resulting from contact of the received gas with vaporized material. Vaporizer 110 supports material to be vaporized to help increase exposed surface area of material to be vaporized to help promote contact of the received gas with vaporized material.

By helping to promote contact of the received gas with vaporized material, vaporizer 110 for one or more embodiments may be used to help deliver the resulting gas to process equipment 120 at relatively higher flow rates.

Figure 2:
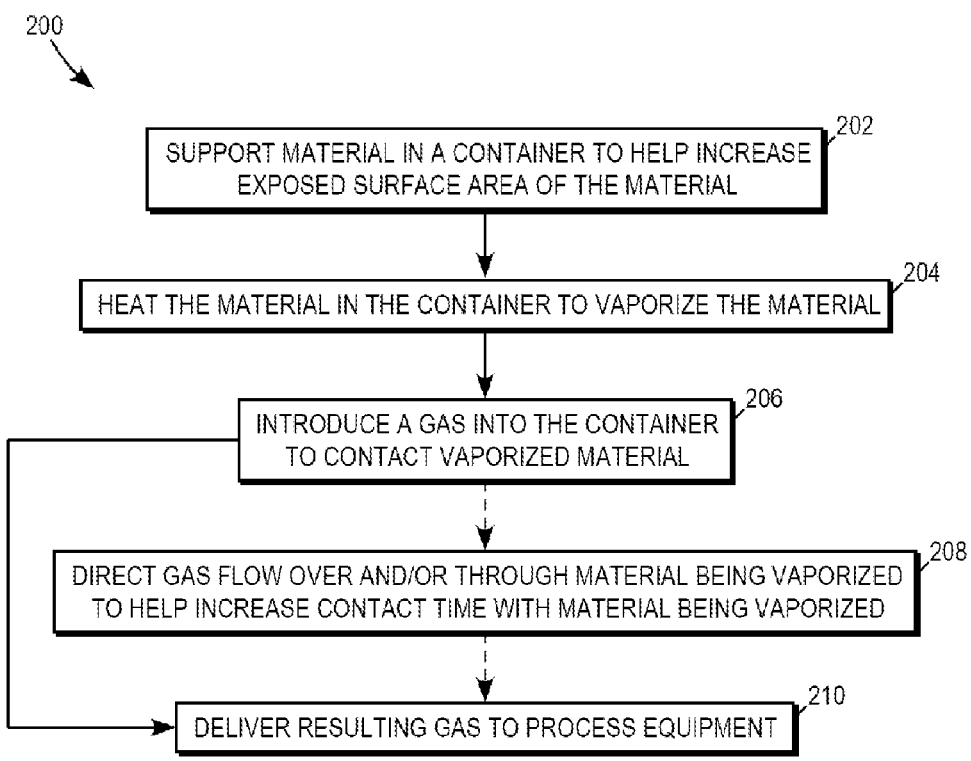
FIG. 2 illustrates, for one or more embodiments, a flow diagram for gas delivery in the system of FIG. 1.

Vaporizer 110 for one or more embodiments may be used to deliver a desired gas to process equipment 120 in accordance with a flow diagram 200 of FIG. 2.

For block 202 of FIG. 2, material to be vaporized is supported in a container of vaporizer 110 to help increase exposed surface area of material to be vaporized.

Vaporizer 110 may be used to vaporize any suitable material in any suitable one or more states and/or in any suitable one or more forms. The material to be vaporized for one or more embodiments may depend at least in part, for example, on the process or operation to be performed by process equipment 120.

Vaporizer 110 for one or more embodiments may be used to vaporize any suitable material in a solid state. Vaporizer 110 for one or more embodiments may be used to vaporize, for example, any suitable solid material characterized by a sublimation temperature in the range of, for example, approximately 20 degrees Celsius to approximately 300 degrees Celsius and a vapor pressure in the range of, for example, approximately 10-2 Torr to approximately 103 Torr. Vaporizer 110 may be used to vaporize, for example, any suitable material comprising boron (B), phosphorous (P), copper (Cu), gallium (Ga), arsenic (As), ruthenium (Ru), indium (In), antimony (Sb), lanthanum (La), tantalum (Ta), iridium (Ir), decaborane ($B_{10}H_{14}$), hafnium tetrachloride ($HfCl_4$), zirconium tetrachloride ($ZrCl_4$), indium trichloride ($InCl_3$), a metal organic β-diketonate complex, cyclopentadienyl cycloheptatrienyl titanium (CpTiChT), aluminum trichloride ($AlCl_3$), titanium iodide ($Ti_xI_y$), cyclooctatetraene cyclopentadienyl titanium ((Cot)(Cp)Ti), bis(cyclopentadienyl)titanium diazide, tungsten carbonyl ($W_x(CO)_y$), bis(cyclopentadienyl)ruthenium (II) ($Ru(Cp)_2$), and/or ruthenium trichloride ($RuCl_3$). Vaporizer 110 may be used to vaporize any suitable solid material in any suitable form such as, for example, a powder, agglomerated particles, one or more crystalline bodies, and/or a film. A crystalline body may have any suitable size and shape, such as a tablet, brick, or puck shape for example.

Vaporizer 110 for one or more embodiments may be used to vaporize any suitable material in a liquid state. Vaporizer 110 may be used to vaporize, for example, any suitable material comprising tertiaryamylimidotris(dimethylamido) tantalum (Taimata), tetrakis-(diethylamido)titanium (TDEAT), tetrakis-(dimethylamido)titanium (TDMAT), pentakis dimethyl-amidotantalum (PDMAT), tantalum pentaethoxide (TAETO), and bis(ethylcyclopentadienyl)ruthenium (II) ($Ru(EtCp)_2$). Vaporizer 110 for one or more embodiments may be used to heat any suitable material in a solid state to a liquid state prior to vaporizing the material.

Vaporizer 110 for or more embodiments may be used to vaporize any suitable material having two or more distinct substances in any suitable state and/or form.

Vaporizer 110 may comprise any suitable structure to help support material to be vaporized in any suitable container in any suitable manner to help increase exposed surface area of the material. The structure may be defined, positioned, and/or coupled in any suitable container in any suitable manner. The structure for one or more embodiments may help support material in the container to help increase exposed surface area of the material relative to a maximum exposed surface area the material could have at rest in the container absent the structure.

The structure for one or more embodiments may help support any suitable material for vaporization in the same form as when the material is placed at the structure. In this manner, material to be vaporized for one or more embodiments may be manually or automatically placed at the structure and vaporized without further preparation or conditioning of such material. As one example, any suitable liquid material may be placed at the structure and vaporized while still in liquid form. As another example, any suitable solid material in any suitable form, such as a powder, agglomerated particles, and/or one or more crystalline bodies for example, may be placed at the structure and vaporized while still in that same form.

The structure for one or more embodiments may define in any suitable manner one or more material support surfaces to help support material in the container with an increased exposed surface area. The structure for one or more embodiments may define in any suitable manner one or more material support surfaces in an interior region of the container in addition to a bottom surface of the interior region of the container. The structure for one or more embodiments may define in an interior region of the container one or more material support surfaces having a total surface area greater than a surface area of a bottom surface of the interior region of the container. The structure for one or more embodiments may define a plurality of material support surfaces at different levels in the container. The structure for one or more embodiments may define one or more material support surfaces that span different levels in the container. The structure for one or more embodiments may define one or more material support surfaces of any suitable shape or contour. The structure for one or more embodiments may define one or more generally planar material support surfaces. The structure for one or more embodiments may comprise an integral body to define one or more material support surfaces. The structure for one or more embodiments may comprise a plurality of bodies to define one or more material support surfaces.

For one or more embodiments where material to be vaporized is in a liquid state or in a solid state in the form of, for example, a powder, agglomerated particles, and/or one or more crystalline bodies, the structure may help support and optionally help contain such material over one or more material support surfaces in any suitable manner. For one or more embodiments where material to be vaporized is in a solid state in the form of a film, the material may be formed in any suitable manner over one or more material support surfaces. For one or more embodiments where material to be vaporized has two or more distinct substances, the structure for one or more embodiments may optionally help support different substances of the material over different material support surfaces.

The structure for one or more embodiments may help support any suitable material over one or more material support surfaces for vaporization in the same form as when the material is placed over such material support surface(s). In this manner, material to be vaporized for one or more embodiments may be manually or automatically placed over one or more material support surfaces and vaporized without further preparation or conditioning of such material. As one example, any suitable liquid material may be placed over one or more material support surfaces and vaporized while still in liquid form. As another example, any suitable solid material in any suitable form, such as a powder, agglomerated particles, and/or one or more crystalline bodies for example, may be placed over one or more material support surfaces and vaporized while still in that same form.

The structure for one or more embodiments may define in any suitable manner at least a portion of a material support surface over any suitable at least partially permeable material to help support material to be vaporized while allowing a suitable gas to flow through the material support surface. By also exposing surface area of material to be vaporized through one or more material support surfaces, vaporizer 110 may help increase exposed surface area of the material to be vaporized.

The structure for one or more embodiments may define in any suitable manner one or more passages that turn, curve, and/or wind in any suitable manner in the container. Such structure may then help support material to be vaporized in one or more passages to help increase exposed surface area of the material. The structure may define one or more passages of any suitable size and shape. The structure for one or more embodiments may comprise a tube to define a passage. The structure for one or more embodiments may comprise a series of coupled tubes to define a passage. The structure for one or more embodiments may comprise an integral body defining one or more passages. The structure for one or more embodiments may comprise a plurality of bodies coupled to define one or more passages.

For one or more embodiments where material to be vaporized is in a liquid state or in a solid state in the form of, for example, a powder, agglomerated particles, and/or one or more crystalline bodies, the material may be poured to fill a portion of one or more passages. For one or more embodiments where material to be vaporized is in a solid state in the form of a film, the material may be formed in any suitable manner to any suitable thickness along at least a portion of an inner wall or walls of one or more passages. For one or more embodiments where material to be vaporized has two or more distinct substances, the structure for one or more embodiments may optionally help support different substances of the material in different passages.

The structure for one or more embodiments may define in any suitable manner a mesh of any suitable material to help support material to be vaporized to help increase exposed surface area of the material. As one example, such structure may comprise steel wool of any suitable density. For one or more embodiments where material to be vaporized is in a solid state in the form of, for example, a powder, agglomerated particles, and/or one or more crystalline bodies, the material may be poured into the mesh structure.

The structure for one or more embodiments may have one or more porous bodies to help support material to be vaporized to help increase exposed surface area of the material. Such a porous body or bodies may be of any suitable size and shape and may be formed using any suitable material, such as a porous stainless steel of any suitable density for example. Such a porous body or bodies for one or more embodiments may be charged with material to be vaporized in any suitable manner and/or may help support material to be vaporized over one or more surfaces of the porous body or bodies. A porous body for one embodiment may have pores of a larger size toward, at, or near a first end of the porous body and pores of a smaller size toward, at, or near an opposite second end of the porous body to help prevent material in the porous body from exiting the porous body prior to being vaporized as gas flows into the first end of the porous body and through the porous body to exit from the second end of the porous body. For one or more embodiments having a plurality of porous bodies, such porous bodies may be defined, positioned, and/or coupled in a container in any suitable manner. A plurality of porous bodies for one or more embodiments may be defined, positioned, and/or coupled in a stack in a container. A porous body in such a stack may or may not be spaced from any subjacent or any superjacent porous body in the stack.

The structure for one or more embodiments may be defined in any suitable manner to help support one or more bags of material to be vaporized with at least a portion of a bag formed from any suitable at least partially permeable material, such as a suitable membrane material for example, to help support material to be vaporized in the bag while allowing a suitable gas to flow into the bag and/or vapor from material in the bag to flow out of the bag. The structure for one or more embodiments may support one or more such bags to expose surface area of the bag(s) in any suitable manner to help increase exposed surface area of material to be vaporized. As one example, the structure may help support a bag to expose opposite sides of the bag to expose surface area of material to be vaporized at both opposite sides of the bag. For one or more embodiments, one or more bags of material to be vaporized may be placed in and/or on the structure in any suitable manner. For one or more embodiments where material to be vaporized has two or more distinct substances, the structure for one or more embodiments may optionally help support different substances of the material in different bags.

For block 204 of FIG. 2, material in the container is heated to vaporize the material. The material may be heated in any suitable manner to any suitable temperature using any suitable heating equipment to help transform the material into a gas or vapor state. The container for one or more embodiments may define and/or have any suitable structure to help increase heated surface area in the container to help increase the rate of vaporization of material in the container. The container for one or more embodiments may define and/or have any suitable structure to help increase heated surface area in the container relative to a maximum heated surface area the container could have absent such structure.

For one or more embodiments, the structure to help support material to be vaporized to help increase exposed surface area of the material may be defined to help conduct heat and therefore help increase heated surface area in the container.

For block 206, a gas is introduced into the container of vaporizer 110 to contact vaporized material. Vaporizer 110 may be coupled to any suitable gas source 130 in any suitable manner to receive any suitable gas in the container in any suitable manner. Because vaporizer 110 supports material in the container with an increased exposed surface area, vaporizer 110 helps provide a larger interface area at which vaporized material may interact with gas in the container and therefore helps promote contact of introduced gas with vaporized material.

Vaporizer 110 for one or more embodiments may receive any suitable carrier gas to help deliver any suitable vaporized material to process equipment 120. By helping to promote contact of carrier gas with vaporized material, vaporizer 110 may then help promote saturation of carrier gas with vaporized material.

Vaporizer 110 for one or more embodiments may receive any suitable gas that is reactive with any suitable vaporized material to deliver any suitable resulting gas to process equipment 120. By helping to promote contact of introduced gas with vaporized material, vaporizer 110 may then help promote chemical reaction of introduced gas with vaporized material.

The gas to be received by vaporizer 110 may depend at least in part, for example, on the material to be vaporized and/or on the process or operation to be performed by process equipment 120. For one or more embodiments where vaporizer 110 is to receive a carrier gas, vaporizer 110 may receive a carrier gas comprising, for example, hydrogen (H), helium (He), nitrogen (N), oxygen (O), argon (Ar), carbon monoxide (CO), and/or carbon dioxide ($CO_2$). For one or more embodiments where vaporizer 110 is to receive a gas reactive with vaporized material, vaporizer 110 may receive a gas comprising, for example, carbon monoxide (CO), nitrosyl, and/or nitric oxide (NO). Vaporizer 110 for one or more embodiments may receive a mixture of a gas reactive with vaporized material and any suitable inert gas, such as nitrogen (N) or helium (He) for example.

For block 208 of FIG. 2, vaporizer 110 may optionally direct gas flow over and/or through material being vaporized to help increase contact time of introduced gas with material being vaporized. Vaporizer 110 for one or more embodiments may then help promote contact of introduced gas with vaporized material despite any variations in the vaporization rate of the material and/or any variations in the concentration of the vaporized material in the container. Vaporizer 110 may comprise any suitable structure to help direct gas flow over and/or through material being vaporized in any suitable manner.

For one or more embodiments where material to be vaporized is supported over one or more material support surfaces, vaporizer 110 may comprise structure to define one or more passageways through one or more material support surfaces to help direct gas flow over material being vaporized. Such passageway(s) may be defined, for example, to help direct gas flow directly over material being vaporized and/or toward any suitable structure to help direct gas flow to circulate or whirl over material being vaporized.

Vaporizer 110 for one or more embodiments may comprise any suitable baffle or diffuser structure to help direct gas flow directly over material being vaporized and/or to help direct gas flow to circulate or whirl over material being vaporized.

For one or more embodiments, the structure to help support material to be vaporized may also serve to help direct gas flow over and/or through material being vaporized. For one or more embodiments where vaporizer 110 comprises structure to help support material to be vaporized over at least partially permeable material, gas flow may be directed through the at least partially permeable material to flow through material being vaporized. For one or more embodiments where vaporizer 110 comprises structure to help support material to be vaporized in one or more passages that turn, curve, and/or wind in the container, gas flow may be directed through the defined passage(s) to flow over material being vaporized. For one or more embodiments where vaporizer 110 comprises structure to define a mesh to help support material to be vaporized, gas flow may be directed through the mesh to flow over material being vaporized. For one or more embodiments where vaporizer 110 comprises structure having one or more porous bodies to help support material to be vaporized, gas flow may be directed through one or more porous bodies to flow over material being vaporized in one or more porous bodies and/or to flow through material being vaporized over one or more surfaces of one or more porous bodies.

For block 210 of FIG. 2, gas resulting from contact of introduced gas with vaporized material is delivered to process equipment 120. Vaporizer 110 may be coupled to any suitable process equipment 120 in any suitable manner to deliver the resulting gas to process equipment 120. Because vaporizer 110 helps promote contact of introduced gas with vaporized material, gas for one or more embodiments may be introduced into the container of vaporizer 110 at a relatively higher flow rate to help deliver the resulting gas at a relatively higher flow rate to process equipment 120.

Vaporizer 110 for one or more embodiments may be used to deliver any suitable gas for use in any suitable semiconductor process to be performed by any suitable process equipment 120 in response to receiving the delivered gas. Vaporizer 110 for one or more embodiments may be used to deliver any suitable gas for use in any suitable chemical vapor deposition (CVD) process such as, for example, an atomic layer deposition (ALD) process, a plasma enhanced atomic layer deposition (PEALD) process, a metal organic chemical vapor deposition (MOCVD) process, or a plasma enhanced chemical vapor deposition (PECVD) process.

For one or more embodiments where vaporizer 110 is to deliver gas to process equipment 120 to perform an atomic layer deposition (ALD) process that uses multiple bursts of delivered gas spaced in time to deposit a film over a substrate one monolayer at a time, vaporizer 110 for one or more embodiments may continue to produce gas to be delivered to process equipment 120 while process equipment 120 is not drawing any gas from vaporizer 110 between such bursts. Because vaporizer 110 supports material to be vaporized to help increase exposed surface area of material to be vaporized to help promote contact of received gas with vaporized material, vaporizer 110 for one or more embodiments may produce gas and deliver gas to process equipment 120 with reduced or minimized concern for providing a sufficient flow rate of delivered gas when drawn by process equipment 120.

Vaporizer 110 for one or more embodiments may be used to deliver any suitable gas for use in any suitable ion implantation process.

Operations for blocks 202, 204, 206, 208, and/or 210 may be performed in any suitable order and may or may not be performed so as to overlap in time the performance of any suitable operation with any other suitable operation. As one example, material in the container may be heated for block 204 as gas is introduced into the container for block 206.

Although described in connection with process equipment 120, vaporizer 110 may be used to deliver any suitable gas to any suitable equipment for any suitable purpose.

As used in this detailed description, directional terms such as, for example, top, bottom, up, and down are used for convenience to describe vaporizer 110 relative to one frame of reference regardless of how vaporizer 110 or any component of vaporizer 110 may be oriented in space.

Example Structure to Support Material with Increased Surface Area

Figure 3:
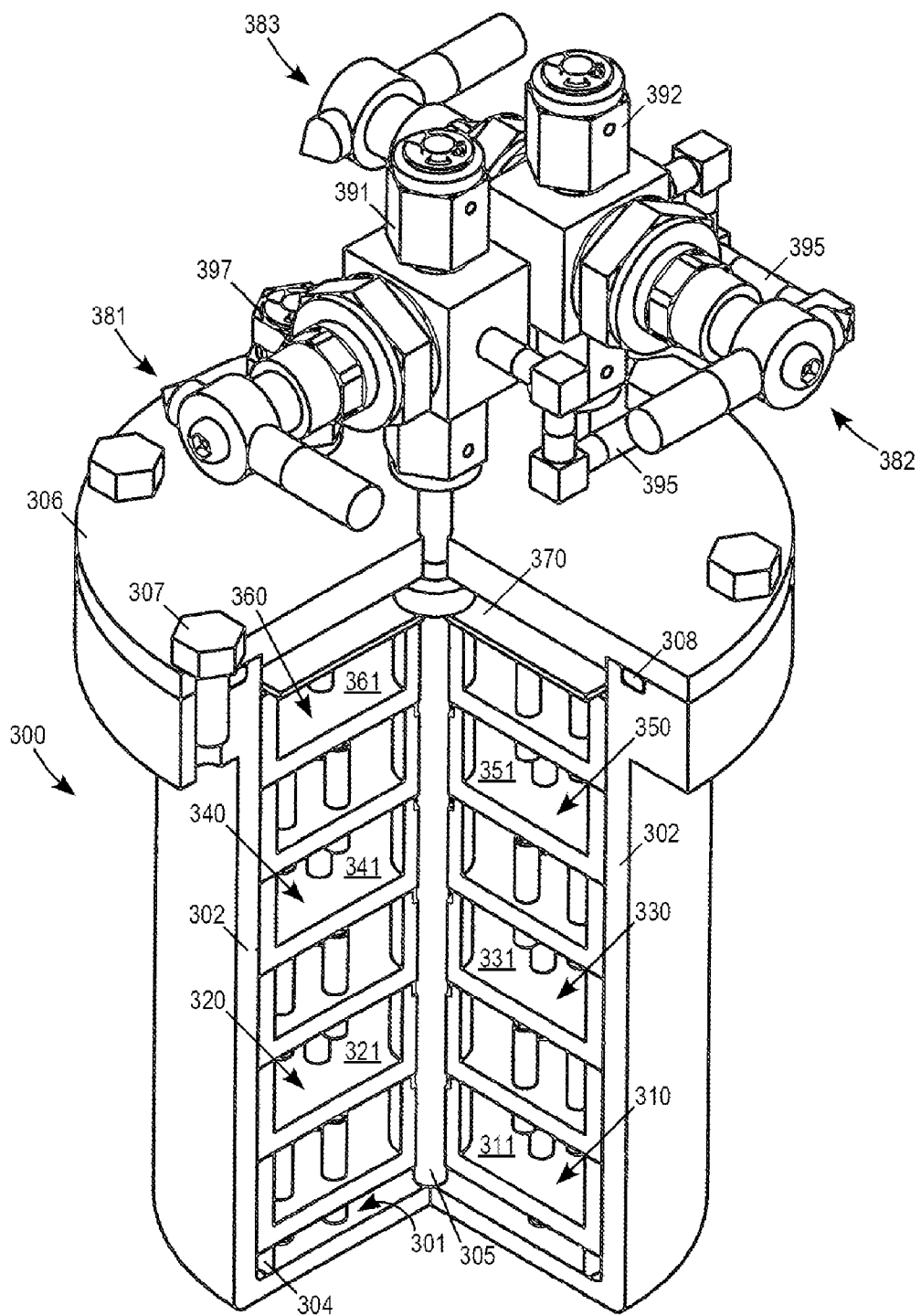
FIG. 3 illustrates, for one example embodiment, a perspective, broken view of a vaporizer container having holders to help promote contact of a gas with vapor from material supported by the holders.

Vaporizer 110 for one or more embodiments may comprise a container having one or more holders defining one or more support surfaces to help support material to help increase exposed surface area of material. FIG. 3 illustrates, for one example embodiment, a container 300 having a plurality of holders 310, 320, 330, 340, 350, and 360 defining respective support surfaces 311, 321, 331, 341, 351, and 361.

The container may define in any suitable manner any suitable one or more interior regions in which one or more holders may be defined, positioned, and/or coupled in any suitable manner. The container may define one or more interior regions of any suitable size and shape. The container for one embodiment may have one or more sidewalls, a bottom wall, and/or a top wall to help define an interior region of any suitable size and shape. The container for one or more embodiments may define in any suitable manner any suitable one or more openings through which material to be vaporized may be placed over, on, and/or in one or more holders in an interior region and/or through which one or more holders may be inserted into an interior region. The container may define one or more openings of any suitable size and shape and in any suitable location relative to one or more interior regions.

The container for one embodiment may have a bottom wall and one or more sidewalls to help define an interior region of any suitable size and shape with an opening of any suitable size and shape at or near the top of the container generally opposite the bottom wall. As illustrated in the example embodiment of FIG. 3, container 300 may have a bottom wall having a surface 301 and a sidewall 302 to help define a generally cylindrical interior region in container 300 with a generally circular opening at or near the top of container 300. The inner diameter of the generally cylindrical interior region for one or more embodiments may be in the range of, for example, approximately 3 inches to approximately 6 inches and for one embodiment may be, for example, approximately 3.75 inches. The container for one embodiment may have a bottom wall and four sidewalls to help define a generally parallelepiped-shaped interior region in the container with a generally rectangular opening at or near the top of the container generally opposite the bottom wall.

The container for one embodiment may have a top wall, one or more sidewalls, and a bottom wall to help define an interior region of any suitable size and shape with an opening of any suitable size and shape on a side of the container. The container for one embodiment may have a top wall, three sidewalls, and a bottom wall to help define a generally parallelepiped-shaped interior region in the container with a generally rectangular opening at a fourth side of the container.

The container for one or more embodiments may define one or more interior regions of any suitable size and shape to help heat material in such interior region(s). For one or more embodiments where material in the container may be heated through one or more sidewalls of the container, the container for one or more embodiments may define an elongated interior region to help support material in the container in proximity to a sidewall.

The container may be formed in any suitable manner using any suitable material. The container for one embodiment may be formed using any suitable material that helps conduct heat to help heat and therefore help vaporize material in the container. Examples of suitable materials for the container may include, without limitation, stainless steel, aluminum, aluminum alloys, copper, copper alloys, silver, silver alloys, lead, nickel clad, graphite, ceramic material, Hastelloy, Inconel, Monel, and/or one or more polymers. The container for one or more embodiments may be formed using a composite of materials, layered materials, and/or lined materials. Although container 300 is illustrated in the example embodiment of FIG. 3 as having an integral body, the container for another embodiment may be formed from separate pieces. The container for one or more embodiments may be of a suitable conventional ampoule used for vaporizing material for delivery to processing equipment.

Any suitable number of one or more holders may be defined, positioned, and/or coupled in any suitable container in any suitable manner to help increase exposed surface area of material. Any suitable number of one or more holders may be used for one or more embodiments to help support material in an interior region of a container with an increased exposed surface area relative to a maximum exposed surface area the same total amount of material could have at rest on a bottom surface of the interior region of the container absent any holders in the interior region. For one embodiment, material to be vaporized may optionally be supported on a bottom surface of an interior region of a container in addition to being supported by one or more holders in the interior region. Any suitable number of two or more holders may be used for one or more embodiments to help support material in an interior region of a container such that the total surface area of the surfaces defined by such holders to help support material is greater than the surface area of a bottom surface of the interior region.

One or more holders for one embodiment may be defined, positioned, and/or coupled to help support material to be vaporized at different levels in a container. One or more holders for one embodiment may be defined, positioned, and/or coupled to define one or more support surfaces over a bottom surface in an interior region of a container. A plurality of holders for one embodiment may be defined, positioned, and/or coupled to define a plurality of support surfaces at different levels in a container.

As illustrated in the example embodiment of FIG. 3, holder 310 may be positioned over bottom surface 301 to define support surface 311 over bottom surface 301, holder 320 may be positioned over holder 310 to define support surface 321 over support surface 311; holder 330 may be positioned over holder 320 to define support surface 331 over support surface 321; holder 340 may be positioned over holder 330 to define support surface 341 over support surface 331; holder 350 may be positioned over holder 340 to define support surface 351 over support surface 341; and holder 360 may be positioned over holder 350 to define support surface 361 over support surface 351. Although illustrated in the example embodiment of FIG. 3 as using six holders 310, 320, 330, 340, 350, and 360, any suitable number of one or more holders, such as three, four, or five for example, may be used for one or more other embodiments.

Any suitable amount of any suitable material in any suitable one or more states and/or form may be placed or formed over, on, and/or in one or more holders in any suitable manner. The material may comprise, for example, a solid and/or a liquid. Where the material to be vaporized comprises a solid, such material may be in any suitable form such as, for example, a powder, agglomerated particles, one or more crystalline bodies, and/or a film. Material to be vaporized for one embodiment may be manually placed or formed over, on, and/or in one or more holders in any suitable manner. Material to be vaporized for one embodiment may be automatically placed or formed over, on, and/or in one or more holders in any suitable manner using any suitable equipment.

Material to be vaporized for one embodiment may be placed over, on, and/or in one or more holders while contained in one or more bags with at least a portion of a bag formed from any suitable at least partially permeable material, such as a suitable membrane material for example, to help support material to be vaporized in the bag while allowing a suitable gas to flow into the bag and/or vapor from material in the bag to flow out of the bag. Material to be vaporized for one embodiment may be placed over, on, and/or in one or more holders while contained in one or more bags with at least a portion of a bag formed from any suitable material that will at least partially disintegrate when heated.

One or more holders for one embodiment may be at least partially coated with material to be vaporized in any suitable manner to form a film over one or more support surfaces. As one example, a suitable material, such as a metal complex for example, may be melted, applied over one or more support surfaces, and then cooled. As another example, a suitable material, such as a metal complex for example, may be dissolved in a solvent and applied over one or more support surfaces followed by removal of the solvent.

Material to be vaporized for one embodiment may also optionally be placed or formed over a bottom surface of an interior region of a container.

One or more holders for one or more embodiments may be separable from one or more other holders and removable from a container to help facilitate cleaning and/or refilling such holder(s). One or more such holders may be placed in a container in any suitable manner. One or more holders for one embodiment may be manually placed in a container. One or more holders for one embodiment may be automatically placed in a container in any suitable manner using any suitable equipment. The placement or formation of material over a support surface of a removable holder may be performed prior to, while, or after the holder is placed in the container.

A plurality of removable holders for one embodiment may optionally be placed in a stack in an interior region of a container. A plurality of separable and removable holders for one embodiment may be placed in a container one at a time. After a first holder has been placed in a container, a second holder for one embodiment may be placed in the container to rest on the first holder and any subsequent holder may then be placed in the container to rest on the top holder in the container. One or more holders for one embodiment may be placed in a container to rest directly on another holder. One or more holders for one embodiment may be placed in a container to rest indirectly on another holder where, for example, a gasket or any other suitable structure is placed over the other holder.

One or more holders for one embodiment may be placed in a container defining and/or having structure to help support one or more holders in the container. Such structure may be integral with and/or separate from the container. As one example, one or more inner walls of a container may be shaped with one or more ledges to help support one or more holders.

A plurality of removable holders for one embodiment may be placed in a container together in any suitable manner. A plurality of holders for one embodiment may be coupled to one another in any suitable manner prior to placement of the holders in a container.

Material to be vaporized for one embodiment may be placed over one or more support surfaces of one or more removable holders while in a dry box or glove box, for example, and the holder(s) may be placed in a container while in the dry box or glove box to help reduce, minimize, or avoid reaction of the material with, for example, oxygen and/or moisture.

A holder may define one or more support surfaces with any suitable size, contour, and shape. A holder for one or more embodiments may optionally have one or more sidewalls and/or one or more supports of any suitable size and shape relative to a support surface to help support one or more other holders, for example, positioned over the holder and to help define a region through which gas may flow over material supported by the holder. A holder for one embodiment may have one or more sidewalls along at least a portion of the perimeter of a support surface. Such sidewall(s) for one embodiment may be defined to help contain any suitable amount of material supported by the holder. Such sidewall(s) for one embodiment may optionally be grooved along the top to help position a gasket between the holder and a superjacent holder, for example.

Figure 4:
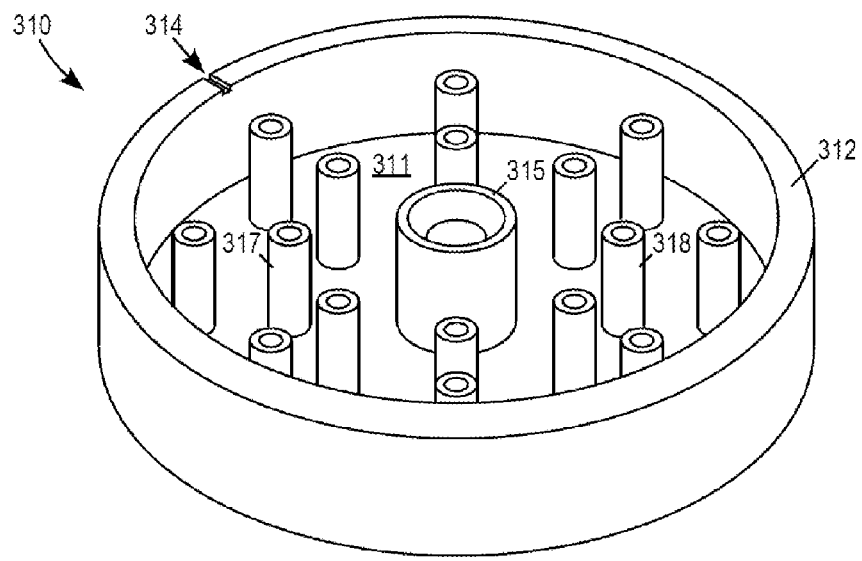
FIG. 4 illustrates, for one example embodiment, a perspective view of a holder.

As illustrated in the example embodiment of FIG. 4, holder 310 may define a generally planar support surface 311 generally circular in shape and may have a generally cylindrical sidewall 312 along the perimeter of support surface 311.

A holder may be formed in any suitable manner using any suitable material. A holder for one embodiment may be formed using any suitable material that helps conduct heat to help heat and therefore help vaporize material supported by the holder. Examples of suitable materials for a holder may include, without limitation, stainless steel, aluminum, aluminum alloys, copper, copper alloys, silver, silver alloys, lead, nickel clad, graphite, ceramic material, Hastelloy, Inconel, Monel, and/or one or more polymers. A holder for one or more embodiments may be formed using a composite of materials, layered materials, and/or lined materials. The material(s) used to form a holder may or may not be the same as the material(s) used to form any container in which the holder may be positioned. The material(s) used to form a holder may or may not be the same as the material(s) used to form any other holder to be positioned in a same container. Although holder 310 is illustrated in the example embodiment of FIGS. 3 and 4 as having an integral body defining support surface 311 and sidewall 312, one or more holders for another embodiment may be formed from separate pieces to define one or more support surfaces and/or one or more sidewalls and/or one or more supports.

For one embodiment, two or more holders in a container may be similarly formed to help support material to be vaporized in the container.

The container and one or more holders for one or more embodiments may be designed to help promote heat transfer from the container to one or more holders in any suitable manner. The container and one or more holders for one or more embodiments may be designed to help promote heat transfer from one or more sidewalls of the container to one or more holders through one or more sidewalls of such holder(s). As illustrated in the example embodiment of FIGS. 3 and 4, container 300 may have sidewall 302 to help define a generally cylindrical interior region, and holder 310, for example, may have a generally cylindrical sidewall 312 the outer surface of which may be used to help provide thermal contact with the inner surface of sidewall 302 when holder 310 is positioned in container 300.

The container and one or more holders for one embodiment may optionally be manufactured to allow a clearance between the inner surface of one or more sidewalls of the container and the outer surface of one or more sidewalls of a holder to be in a predetermined range, such as in the range of approximately $1/1000$th of an inch to approximately $3/1000$th of an inch for example. The placement of one or more holders in the container and/or the removal of one or more holders from the container for one embodiment may be eased by cooling the holder(s) relative to the container and/or heating the container relative to the holder(s). One or more holders for one embodiment may be formed using material having a larger coefficient of thermal expansion relative to material used to form the container to help allow increased clearance between the inner surface of one or more sidewalls of the container and the outer surface of one or more sidewalls of a holder at relatively lower temperatures, such as room temperature for example, while helping to promote thermal contact between the inner surface of one or more sidewalls of the container and the outer surface of one or more sidewalls of a holder at relatively higher temperatures.

Gas Introduction

Gas may be introduced at any suitable flow rate into one or more interior regions of a container at any suitable location. Gas for one or more embodiments may be introduced into an interior region of a container at or near one end in the interior region to flow toward another end in the interior region.

Gas for one or more embodiments may be introduced into an interior region of a container at or near a bottom surface of the interior region and/or a lowermost holder supporting material to be vaporized in the interior region. Gas for one embodiment may be introduced between the lowermost holder supporting material to be vaporized and the bottom surface of the interior region. Gas for one embodiment may be introduced between the lowermost holder supporting material to be vaporized and a next lowermost holder supporting material to be vaporized in the interior region.

Gas may be introduced into an interior region of a container in any suitable manner. Gas for one embodiment may be introduced into an interior region of a container through a passage defined to extend from any suitable location at or near the top of the interior region to any suitable location at or near a bottom surface of the interior region and/or a lowermost holder supporting material to be vaporized in the interior region. The passage may be defined in any suitable manner using any suitable structure.

The passage to introduce gas for one embodiment may be at least partially defined by a tube extending from any suitable location at or near the top of the interior region and through any suitable portion of the interior region to any suitable location at or near the bottom surface of the interior region and/or the lowermost holder supporting material to be vaporized in the interior region. The tube for one embodiment may extend through an opening in at least one holder in the interior region. The tube may be formed from any suitable material and may define a passage of any suitable size and shape.

The tube for one embodiment may extend to any suitable location between the lowermost holder supporting material to be vaporized in the interior region and the bottom surface of the interior region. The lowermost holder in the interior region for one embodiment may be supported above the bottom surface of the interior region by any suitable structure to define a region between that lowermost holder and the bottom surface. For one embodiment, any suitable support structure may be defined by the container on, at, or near the bottom surface of the interior region and/or may be placed in the interior region prior to placing a first holder in the interior region. The first holder may then be placed in the interior region to rest either directly or indirectly on the support structure. For one embodiment, one or more sidewalls of the interior region may define one or more ledges on, at, or near the bottom surface to help support a lowermost holder above the bottom surface.

As illustrated in the example embodiment of FIG. 3, a generally annular support 304 may be placed on bottom surface 301 in the interior region of container 300 to support holder 310 above bottom surface 301. A tube 305 may then extend through openings in holders 360, 350, 340, 330, 320, and 310 in a generally central portion of the interior region of container 300 to a location between holder 310 and bottom surface 301.

The tube for another embodiment may extend to any suitable location between the lowermost holder supporting material to be vaporized in the interior region and a holder superjacent that lowermost holder.

A holder for one or more embodiments may define at any suitable location an opening of any suitable size and shape through which the tube may extend. A holder for one embodiment may have one or more sidewalls along at least a portion of the perimeter of such an opening. Such sidewall(s) for one embodiment may be defined to help contain any suitable amount of material supported by a support surface of the holder. Such sidewall(s) for one embodiment may be formed from any suitable material to help conduct heat and therefore help vaporize material supported by the holder. Such sidewall(s) for one embodiment may be defined to help support one or more other holders positioned over the holder. Such sidewall(s) for one embodiment may optionally be grooved along the top to help position a gasket between the holder and the tube and/or between the holder and a superjacent holder, for example. Such sidewall(s) for one embodiment may be coupled to the holder using any suitable technique such as, for example, by screwing an at least partially threaded sidewall into a threaded opening. Such sidewall(s) for another embodiment may be integrally formed with the holder, for example, to help promote heat transfer to such sidewall(s).

Figure 5:
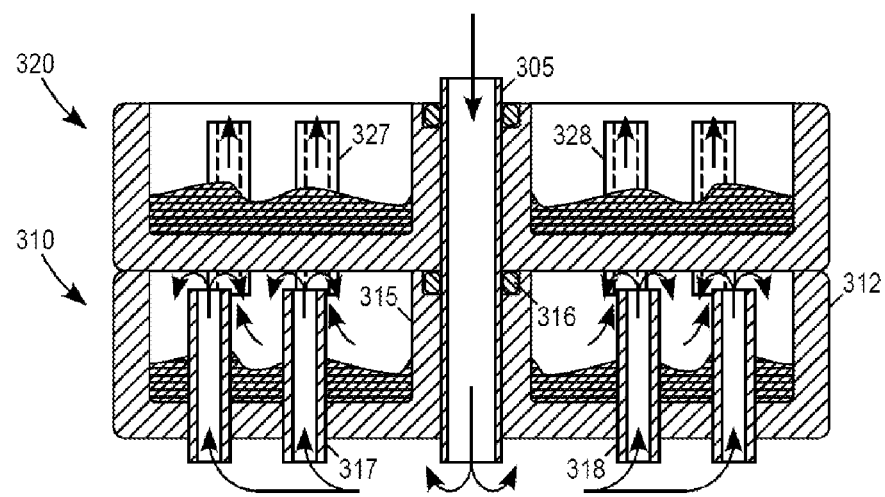
FIG. 5 illustrates, for one example embodiment, a cross-sectional view of a holder positioned over another holder.

As illustrated in the example embodiment of FIGS. 3, 4, and 5, holder 310 may define through a generally central region of support surface 311 a generally circular opening through which tube 305 may extend and may have a generally cylindrical sidewall 315 along the perimeter of that opening with a groove at the top of sidewall 315 to help position an O-ring 316 between holder 310 and tube 305 and between holder 310 and holder 320.

For one embodiment, two or more holders in a container may be similarly formed to define an opening through which a tube may extend. The tube for one embodiment may be inserted through an opening in one or more holders after such holder(s) have been placed in the container. The tube for another embodiment may be inserted through an opening in one or more holders before such holder(s) have been placed in the container, and the tube and holder(s) may then be placed in the container together.

The passage to introduce gas for another embodiment may be at least partially defined to extend within a sidewall from any suitable location at or near the top of an interior region of a container to any suitable location at or near a bottom surface of the interior region and/or a lowermost holder supporting material to be vaporized in the interior region. The passage may be defined within the sidewall to be of any suitable size and shape.

Although described in connection with being introduced through one passage at or near a bottom surface of an interior region and/or a lowermost holder supporting material to be vaporized in the interior region, gas for another embodiment may be introduced into an interior region of a container through a plurality of passages defined to extend to any suitable location at or near a bottom surface of the interior region and/or a lowermost holder supporting material to be vaporized in the interior region. Such a plurality of passages may comprise one or more passages at least partially defined by one or more tubes, one or more passages defined within one or more sidewalls of the interior region, and/or one or more passages defined using any other suitable structure.

Gas for one embodiment may be introduced into an interior region of a container through a bottom wall at a bottom surface of the interior region and/or through a sidewall at a sidewall surface of the interior region at any suitable location at or near the bottom surface and/or a lowermost holder supporting material to be vaporized in the interior region. Gas for one embodiment may be introduced through a plurality of openings defined throughout a bottom surface of an interior region and/or a sidewall surface of the interior region to help better distribute gas in the interior region.

Gas for one or more embodiments may be introduced into an interior region of a container at or near a top end of the interior region and/or a topmost holder supporting material to be vaporized in the interior region to flow toward a bottom end of the interior region.

Gas Flow Over and/or Through Material being Vaporized

Introduced gas may be directed to flow in any suitable manner over and/or through material supported by an end surface of an interior region of a container and/or by one or more holders in the interior region to help increase contact time of introduced gas with material being vaporized. Introduced gas may then more likely contact vaporized material despite any variations in the vaporization rate of the material and/or any variations in the concentration of the vaporized material in the interior region.

For one embodiment where material to be vaporized is supported on a bottom surface of an interior region of a container and where gas is introduced at or near the bottom surface, introduced gas may be directed to flow over and/or through material supported on the bottom surface using any suitable structure. As one example, the example embodiment of FIG. 3 may be modified by coupling a baffle or diffuser at the end of tube 305 to help direct gas flow over material supported on bottom surface 301. For one embodiment where gas is introduced at or near a lowermost holder supporting material to be vaporized, introduced gas may be directed to flow over and/or through material supported by the lowermost holder using any suitable structure.

For one or more embodiments, one or more holders in an interior region of a container may have one or more passageways defined in any suitable manner to help direct the flow of any suitable gas from one end of the interior region toward another end and to help direct such gas flow over and/or through material supported by such holder(s) as gas is directed toward the other end of the interior region.

A holder for one or more embodiments may have at any suitable one or more locations any suitable number of one or more passageways through which gas may flow through the holder. A holder for one embodiment may have at any suitable one or more locations any suitable number of one or more passageways through which gas may flow from below the holder and over and/or through material supported by the holder.

A holder for one embodiment may define through a support surface an opening of any suitable size and shape and may have one or more sidewalls of any suitable size and shape to extend up from the support surface along at least a portion of the perimeter of such an opening to help define a passageway for gas flow through the holder. Such sidewall(s) for one embodiment may be defined to help contain any suitable amount of material supported by the holder. Such sidewall(s) for one embodiment may help direct gas flow to circulate or whirl over material supported by the holder. Such sidewall(s) for one embodiment may be formed from any suitable material to help conduct heat and therefore help vaporize material supported by the holder. Such sidewall(s) for one embodiment may be coupled to the holder using any suitable technique. Such sidewall(s) for another embodiment may be integrally formed with the holder, for example, to help promote heat transfer to such sidewall(s).

As illustrated in the example embodiment of FIGS. 4 and 5, holder 310 may define a generally circular opening through support surface 311, and a tube 317 may be inserted in that opening to define a generally cylindrical sidewall to extend up from support surface 311 along the perimeter of that opening to help define a generally cylindrical passageway through holder 310. Tube 317 may have any suitable size and shape and may define a passageway of any suitable size and shape. Tube 317 may be formed from any suitable material, such as stainless steel for example, and may be inserted in an opening in support surface 311 using any suitable technique. Tube 317 for one embodiment may be press fit into an opening in support surface 311. Tube 317 for another embodiment may have an outer threaded surface and may be screwed into an opening in support surface 311. A threaded tube 317 for one embodiment may allow for adjustability to help optimize gas flow and/or contact time of gas with material being vaporized. One or more other passageways, such as that defined by tube 318 for example, may be similarly defined for holder 310.

A holder for one embodiment may have one or more sidewalls to define one or more generally conical passageways that taper as the sidewall(s) extend up from a support surface of the holder to help reduce, minimize, or avoid backflow of gas. The width and/or thickness of such sidewall(s) for one embodiment may also taper as the sidewall(s) extend up from a support surface of the holder.

A holder for one embodiment may have one or more passageway sidewalls that define one or more vents to allow gas to flow radially through such sidewall(s) and through and/or over material supported by the holder.

For one or more embodiments, two or more holders may have one or more passageways for gas flow through such holders to allow one or more such holders to be positioned to at least partially overlie another such holder. Introduced gas for one embodiment may then be directed to flow over and/or through material supported by an increased number of holders to help increase contact time of introduced gas with material being vaporized.

A superjacent holder for one embodiment may be positioned or oriented relative to a subjacent holder to help avoid aligning one or more passageways of the superjacent holder with one or more passageways of the subjacent holder. A superjacent holder for one embodiment may have one or more passageways at different locations to help avoid aligning one or more passageways of the superjacent holder with one or more passageways of the subjacent holder regardless of how such holders are positioned or oriented relative to one another. By avoiding alignment of passageways, the bottom of the superjacent holder may help direct gas flow exiting one or more passageways through the subjacent holder to circulate or whirl over material supported by the subjacent holder prior to entering one or more passageways through the superjacent holder. Directing gas flow to circulate or whirl over material supported by a holder as the material is vaporized helps increase contact time of the gas with material being vaporized and therefore helps promote contact of the gas with vaporized material.

Superjacent and subjacent holders for one embodiment may optionally define and/or have any suitable structure to help position or orient them relative to one another to help avoid aligning one or more passageways of the superjacent holder with one or more passageways of the subjacent holder. As illustrated in the example embodiment of FIG. 4, a notch 314 may be defined at the top of sidewall 312 to receive a corresponding protuberance extending down from the bottom of a superjacent holder to help orient the superjacent holder relative to holder 310.

For one or more embodiments where one or more passageway sidewalls extend up from a support surface of a subjacent holder, such passageway sidewall(s) for one embodiment may be of any suitable height to help define an exit region of any suitable size between such passageway sidewall(s) and the bottom of a superjacent holder to allow gas flow to exit one or more passageways through the subjacent holder and/or to help circulate or whirl gas flow over material supported by the subjacent holder.

A superjacent holder for one or more embodiments may have one or more sidewalls of any suitable size and shape to extend down from the bottom of the holder along at least a portion of the perimeter of a passageway opening. Such sidewall(s) for one embodiment may help direct gas flow to circulate or whirl over material supported by a subjacent holder prior to entering one or more passageways through the superjacent holder. Such sidewall(s) for one embodiment may be of any suitable depth to help define an entrance region of any suitable size between such sidewall(s) and, for example, the top surface of material supported by the subjacent holder to allow gas flow to enter one or more passageways through the superjacent holder. Such sidewall(s) for one embodiment may be coupled to the holder using any suitable technique. Such sidewall(s) for another embodiment may be integrally formed with the holder.

As illustrated in the example embodiment of FIGS. 3 and 5, holder 320 may define a generally circular opening through support surface 321, and a tube 327 may be inserted in that opening to define a generally cylindrical sidewall to extend down from the bottom of holder 320 along the perimeter of that opening to help define a generally cylindrical passageway through holder 320. Tube 327 may have any suitable size and shape and may define a passageway of any suitable size and shape. Tube 327 may be formed from any suitable material, such as stainless steel for example, and may be inserted in an opening in support surface 321 using any suitable technique. Tube 327 for one embodiment may be press fit into an opening in support surface 321. Tube 327 for another embodiment may have an outer threaded surface and may be screwed into an opening in support surface 321. A threaded tube 327 for one embodiment may allow for adjustability to help optimize gas flow and/or contact time of gas with material being vaporized. One or more other passageways, such as that defined by tube 328 for example, may be similarly defined for holder 320.

As also illustrated in the example embodiment of FIGS. 3 and 5, tube 327 may be inserted through an opening in support surface 321 of holder 320 to define both a generally cylindrical sidewall to extend up from support surface 321 along the perimeter of that opening and a generally cylindrical sidewall to extend down from the bottom of holder 320 along the perimeter of that opening. Tube 327 for one embodiment may be press fit to any suitable position in the opening. Tube 327 for another embodiment may have an outer threaded surface and may be screwed into the opening to any suitable position in the opening. One or more other tubes, such as tube 328 for example, may also define both a generally cylindrical sidewall to extend up from support surface 321 and a generally cylindrical sidewall to extend down from the bottom of holder 320.

For one or more embodiments where one or more passageway sidewalls extend up from a support surface of a subjacent holder and one or more passageway sidewalls extend down from the bottom of a superjacent holder, the top of one or more passageway sidewalls extending up from the support surface of the subjacent holder for one embodiment may be higher than the bottom of one or more passageway sidewalls extending down from the bottom of the superjacent holder to help direct gas flow exiting one or more passageways through the subjacent holder to circulate or whirl over material supported by the subjacent holder prior to entering one or more passageways through the superjacent holder. As illustrated in the example embodiment of FIG. 5, the tops of tubes 317 and 318 for holder 310 may be higher than the bottoms of tubes 327 and 328 for holder 320 to help direct gas flow to circulate or whirl over material supported by holder 310.

A holder for one embodiment may have one or more passageways having a cover over its top to help direct gas flow radially through one or more vents defined between the cover and a passageway sidewall and/or defined in a passageway sidewall. In this manner, the holder may be positioned or oriented relative to a superjacent holder with reduced or minimized concern for avoiding alignment of passageways. The holder may have any suitable structure for a passageway cover. Such structure for one embodiment may be integral with and/or coupled to a passageway sidewall in any suitable manner.

A holder for one or more embodiments may have any suitable number of one or more walls of any suitable size and shape in any suitable location to extend up from a support surface of the holder and may have one or more passageways of any suitable size and shape defined within one or more such wall(s) for gas flow through the holder. Such wall(s) for one embodiment may be defined as having one or more passageways to help ease placement or formation of material over, on, and/or in the holder relative to, for example, a holder having passageway sidewalls spread throughout a support surface. Such wall(s) for one embodiment may be defined to help contain any suitable amount of material supported by the holder. Such wall(s) for one embodiment may help direct gas flow to circulate or whirl over material supported by the holder. Such wall(s) for one embodiment may be formed using any suitable material to help conduct heat and therefore help vaporize material supported by the holder. Such wall(s) for one embodiment may be coupled to the holder using any suitable technique. Such wall(s) for another embodiment may be integrally formed with the holder, for example, to help promote heat transfer to such wall(s).

A holder for one embodiment may have one or more walls of any suitable size and shape to extend up from a support surface of the holder to help partition the support surface and may have one or more passageways of any suitable size and shape defined within one or more such wall(s) for gas flow through the holder. Such wall(s) for one embodiment may be defined in any suitable location to help partition the support surface into any suitable number of two or more regions over which material to be vaporized may be supported.

Figure 6:
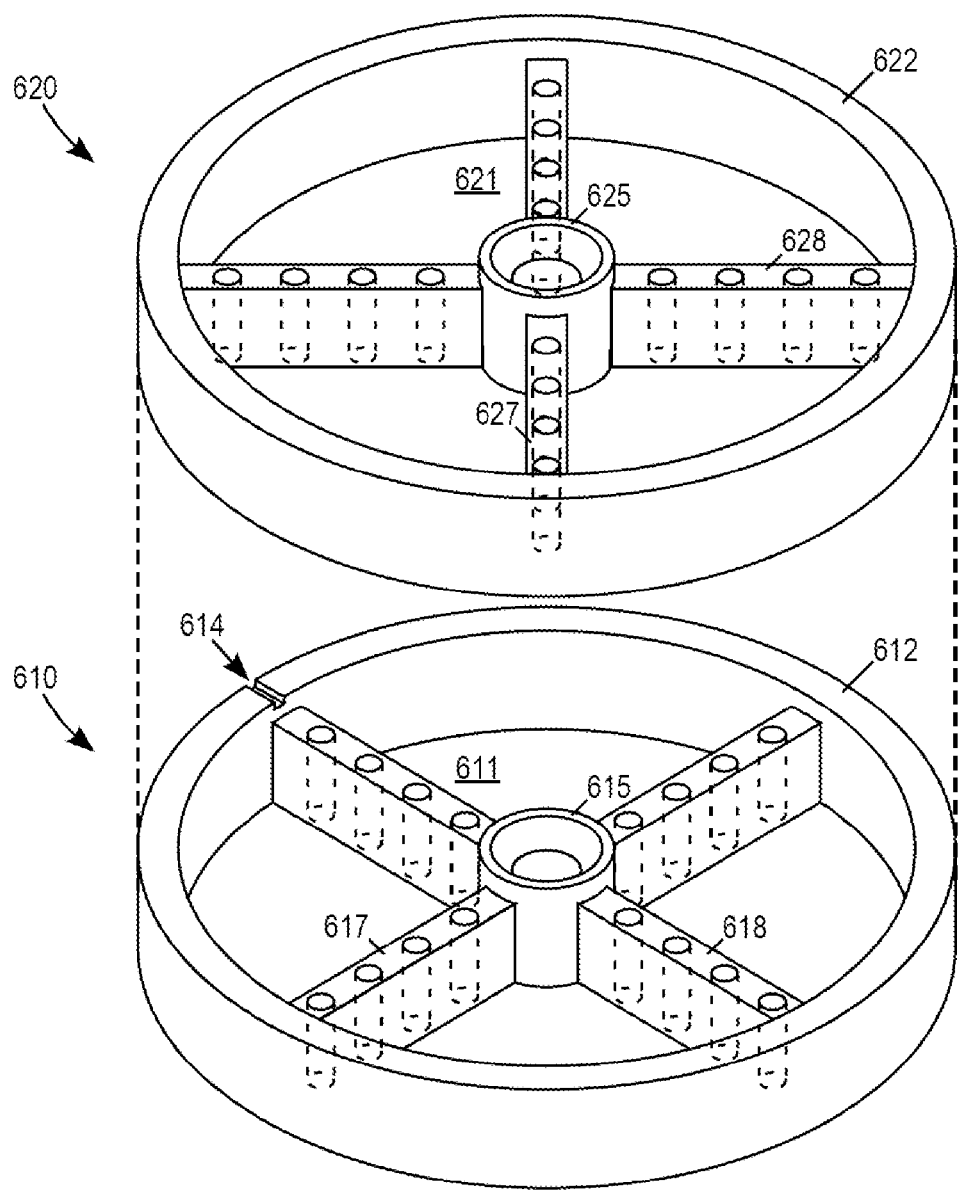
FIG. 6 illustrates, for another example embodiment, a perspective, exploded view of a holder positioned over another holder.

As illustrated in the example embodiment of FIG. 6, a holder 610 may define a support surface 611 and have a sidewall 612 along the perimeter of support surface 611 and a sidewall 615 along the perimeter of an opening through which a tube for gas introduction may extend. Holder 610, support surface 611, sidewall 612, and sidewall 615 generally correspond to holder 310, support surface 311, sidewall 312, and sidewall 315, respectively, of FIGS. 3, 4, and 5. Holder 610 may have a plurality of walls, such as walls 617 and 618 for example, that extend between sidewall 612 and sidewall 615 to partition support surface 611 into multiple regions over which material to be vaporized may be placed or formed. One or more passageways may be defined within one or more such wall(s) rather than, for example, spread throughout support surface 611 to help ease placement or formation of material to be vaporized over, on, and/or in holder 610.

A superjacent holder having one or more walls having one or more passageways for one embodiment may be positioned or oriented relative to a subjacent holder to help direct gas flow exiting one or more passageways through the subjacent holder to flow over material supported by the subjacent holder prior to entering one or more passageways through the superjacent holder. For one embodiment, one or more walls having one or more passageways for the subjacent holder may be of any suitable height to help define an exit region of any suitable size between such wall(s) and the bottom of the superjacent holder to allow gas flow to exit one or more passageways through the subjacent holder and/or to help circulate or whirl gas flow over material supported by the subjacent holder.

As illustrated in the example embodiment of FIG. 6, a superjacent holder 620 may define a support surface 621 and have a sidewall 622 along the perimeter of support surface 621, a sidewall 625 along the perimeter of an opening through which a tube for gas introduction may extend, and a plurality of walls, such as walls 627 and 628 for example, that extend between sidewall 622 and sidewall 625 to partition support surface 621 into multiple regions over which material to be vaporized may be placed or formed. Holder 620, support surface 621, sidewall 622, sidewall 625, and walls 627 and 628 generally correspond to holder 610, support surface 611, sidewall 612, sidewall 615, and walls 617 and 618, respectively. Superjacent holder 620 for one embodiment may be positioned or oriented relative to subjacent holder 610 to help direct gas flow exiting one or more passageways defined within wall 618, for example, to flow over material supported over the two support surface regions adjacent wall 618 prior to entering one or more passageways defined within walls 627 and 628, for example, of superjacent holder 620. A notch 614 may optionally be defined at the top of sidewall 612 to receive a corresponding protuberance extending down from the bottom of superjacent holder 620 to help orient superjacent holder 620 relative to subjacent holder 610.

A holder for one embodiment may have one or more walls of any suitable size and shape to extend up from a support surface of the holder along or near at least a portion of the perimeter of the support surface and may have one or more passageways of any suitable size and shape defined within one or more such wall(s) for gas flow through the holder.

Figure 7:
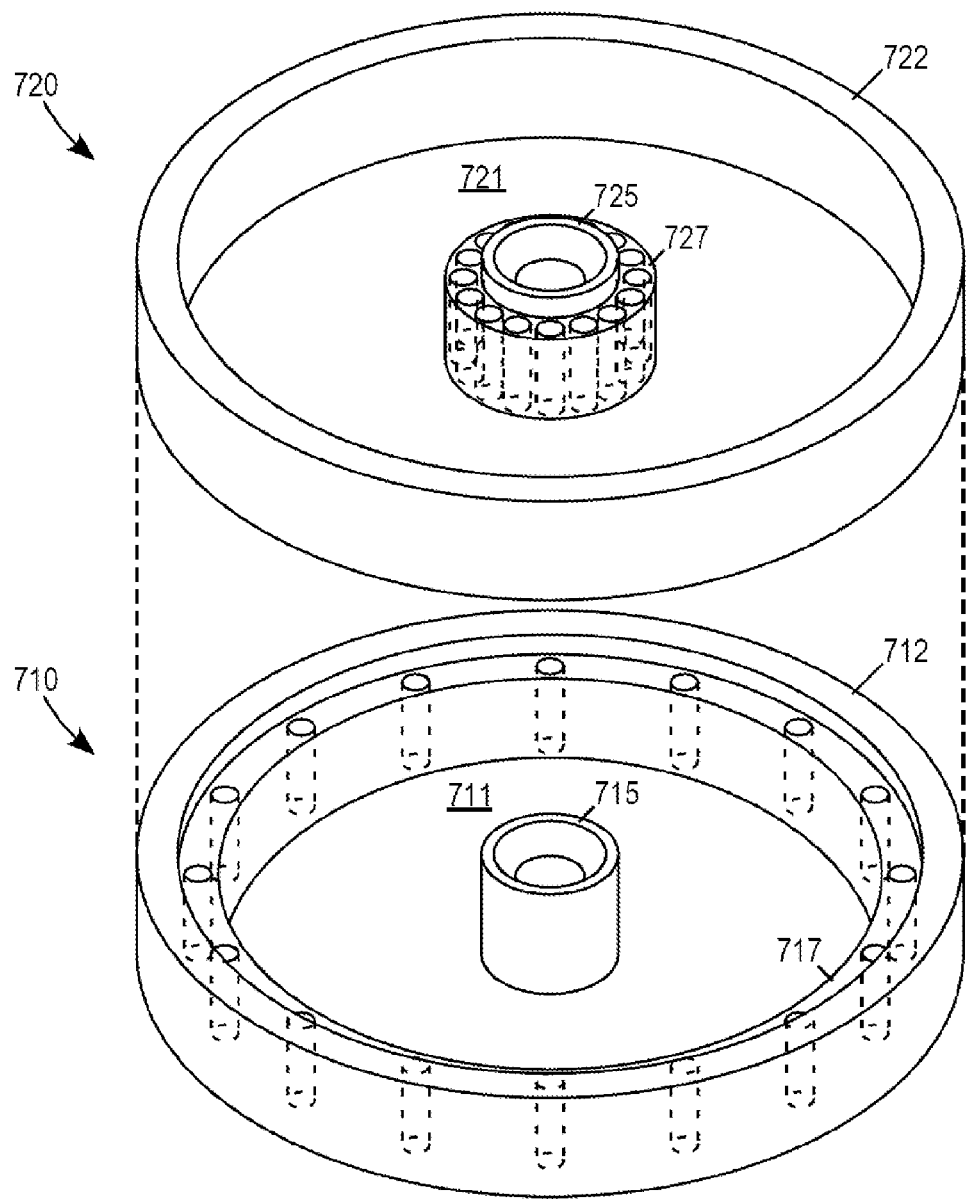
FIG. 7 illustrates, for another example embodiment, a perspective, exploded view of a holder positioned over another holder.

As illustrated in the example embodiment of FIG. 7, a holder 710 may define a support surface 711 and have a sidewall 712 along the perimeter of support surface 711 and a sidewall 715 along the perimeter of an opening through which a tube for gas introduction may extend. Holder 710, support surface 711, sidewall 712, and sidewall 715 generally correspond to holder 310, support surface 311, sidewall 312, and sidewall 315, respectively, of FIGS. 3, 4, and 5. Holder 710 may have a wall 717 along the inner side of sidewall 712 and may have one or more passageways defined within wall 717 rather than, for example, spread throughout support surface 711 to help ease placement or formation of material over, on, and/or in holder 710.

A holder for one embodiment may have one or more walls of any suitable size and shape to extend up from a support surface of the holder at or near a generally central region of the support surface and may have one or more passageways of any suitable size and shape defined within one or more such wall(s) for gas flow through the holder.

As illustrated in the example embodiment of FIG. 7, a holder 720 may define a support surface 721 and have a sidewall 722 along the perimeter of support surface 721 and a sidewall 725 along the perimeter of an opening through which a tube for gas introduction may extend. Holder 720, support surface 721, sidewall 722, and sidewall 725 generally correspond to holder 310, support surface 311, sidewall 312, and sidewall 315, respectively, of FIGS. 3, 4, and 5. Holder 720 may have a wall 727 along the outer side of sidewall 725 and may have one or more passageways defined within wall 727 rather than, for example, spread throughout support surface 721 to help ease placement or formation of material over, on, and/or in holder 720.

A holder having one or more walls having one or more passageways along or near at least a portion of the perimeter of a support surface for one embodiment may be positioned subjacent a holder having one or more walls having one or more passageways at or near a generally central region of a support surface to help direct gas flow exiting one or more passageways through the subjacent holder to flow over material supported by the subjacent holder prior to entering one or more passageways through the superjacent holder. The holder for one embodiment may be positioned or oriented relative to the superjacent holder with reduced or minimized concern for avoiding alignment of passageways. For one embodiment, one or more walls having one or more passageways for the subjacent holder may be of any suitable height to help define an exit region of any suitable size between such wall(s) and the bottom of the superjacent holder to allow gas flow to exit one or more passageways through the subjacent holder and/or to help circulate or whirl gas flow over material supported by the subjacent holder.

As illustrated in the example embodiment of FIG. 7, holder 710 for one embodiment may be positioned subjacent holder 720 to help direct gas flow exiting one or more passageways defined within wall 717 to flow over material supported over support surface 711 prior to entering one or more passageways within wall 727 of superjacent holder 720.

A holder having one or more walls having one or more passageways at or near a generally central region of a support surface for one embodiment may be positioned subjacent a holder having one or more walls having one or more passageways along or near at least a portion of the perimeter of a support surface to help direct gas flow exiting one or more passageways through the subjacent holder to flow over material supported by the subjacent holder prior to entering one or more passageways through the superjacent holder. The holder for one embodiment may be positioned or oriented relative to the superjacent holder with reduced or minimized concern for avoiding alignment of passageways. For one embodiment, one or more walls having one or more passageways for the subjacent holder may be of any suitable height to help define an exit region of any suitable size between such wall(s) and the bottom of the superjacent holder to allow gas flow to exit one or more passageways through the subjacent holder and/or to help circulate or whirl gas flow over material supported by the subjacent holder.

A superjacent holder having one or more walls having one or more passageways for one embodiment may optionally have one or more walls of any suitable size and shape to extend down from the bottom of the holder to extend one or more passageways through the superjacent holder. Such wall(s) for one embodiment may help direct gas flow to circulate or whirl over material supported by a subjacent holder prior to entering one or more passageways through the superjacent holder. Such wall(s) for one embodiment may be of any suitable depth to help define an entrance region of any suitable size between such wall(s) and, for example, the top surface of material supported by the subjacent holder to allow gas flow to enter one or more passageways through the superjacent holder. Such wall(s) for one embodiment may be coupled to the holder using any suitable technique. Such wall(s) for another embodiment may be integrally formed with the holder.

Holder 620 of the example embodiment of FIG. 6, for example, may have one or more walls that extend down from the bottom of holder 620 opposite one or more of the walls partitioning support surface 621, such as walls 627 and/or 628 for example, to extend one or more passageways through holder 620. Holder 720 of the example embodiment of FIG. 7, for example, may have one or more walls that extend down from the bottom of holder 720 opposite wall 727 to extend one or more passageways through holder 720.

A superjacent holder having one or more walls having one or more passageways for one embodiment may optionally have one or more sidewalls of any suitable size and shape to extend down from the bottom of the holder along at least a portion of the perimeter of a passageway opening.

A holder for one embodiment may have passageways through which gas may flow through the holder by defining in any suitable manner at least a portion of a support surface over any suitable at least partially permeable material, such as a porous stainless steel of any suitable density for example. Such a holder may then support material being vaporized over the support surface while allowing any suitable gas to flow through the support surface and then through and/or over material being vaporized. Such a holder for one embodiment may support any suitable liquid material. Such a holder for one embodiment may support any suitable solid material in any suitable form. Such a holder for one embodiment may support any suitable solid material in the form of a powder and/or agglomerated particles to help create a fluidized bed.

Figure 8:
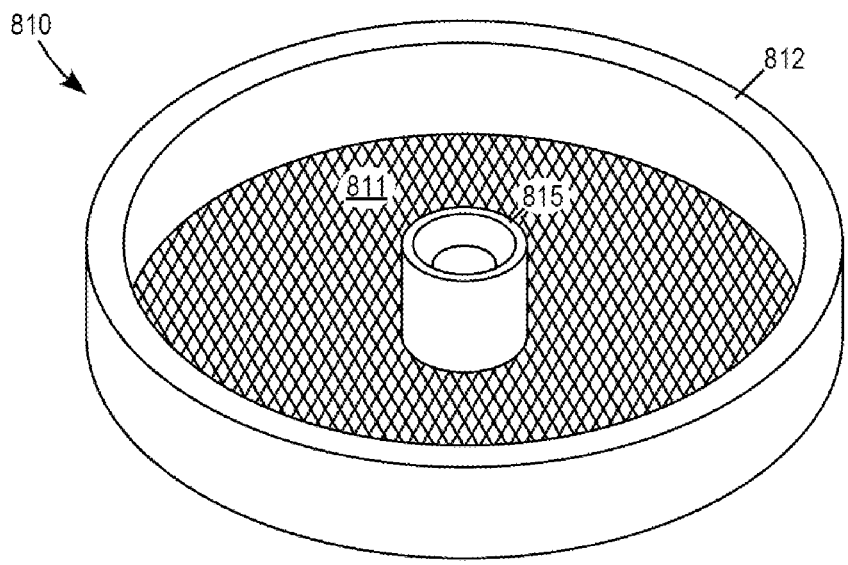
FIG. 8 illustrates, for another example embodiment, a perspective view of a holder.

As illustrated in the example embodiment of FIG. 8, a holder 810 may define a support surface 811 over any suitable at least partially permeable material and have a sidewall 812 along the perimeter of support surface 811 and a sidewall 815 along the perimeter of an opening through which a tube for gas introduction may extend. Holder 810, support surface 811, sidewall 812, and sidewall 815 generally correspond to holder 310, support surface 311, sidewall 312, and sidewall 315, respectively, of FIGS. 3, 4, and 5.

For one or more embodiments where a holder has any suitable at least partially permeable material, such as a porous stainless steel of any suitable density for example, the holder for one or more embodiments may help support material to be vaporized by charging the at least partially permeable material with material to be vaporized in any suitable manner and/or by supporting material to be vaporized over one or more support surfaces over at least a portion of the at least partially permeable material. The at least partially permeable material for one embodiment may have pores of a larger size toward, at, or near a first end, such as a bottom end for example, of the holder and pores of a smaller size toward, at, or near an opposite second end, such as a top end for example, of the holder to help prevent material in the at least partially permeable material from exiting the holder prior to being vaporized as gas flows through the holder.

For one or more embodiments, gas may be directed to flow over and/or through material supported by an end surface of an interior region of a container and/or by one or more holders in the interior region using any suitable baffle or diffuser structure. Such structure may be integral with and/or separate from one or more of such holder(s) and/or the container. Such structure for one embodiment may be integral with and/or coupled to a holder to help direct gas flow over and/or through material supported by the holder. Such structure for one embodiment may be integral with and/or coupled to a superjacent holder to help direct gas flow over and/or through material supported by a subjacent holder.

System to Deliver Resulting Gas

The container in which one or more holders supporting material to be vaporized are defined, positioned, and/or coupled may be coupled to receive any suitable gas from any suitable gas source in any suitable manner, may be heated in any suitable manner using any suitable heating equipment to help vaporize material in the container, and may be coupled to deliver gas resulting from contact of the received gas with vaporized material to any suitable process equipment, for example, in any suitable manner.

Figure 9:
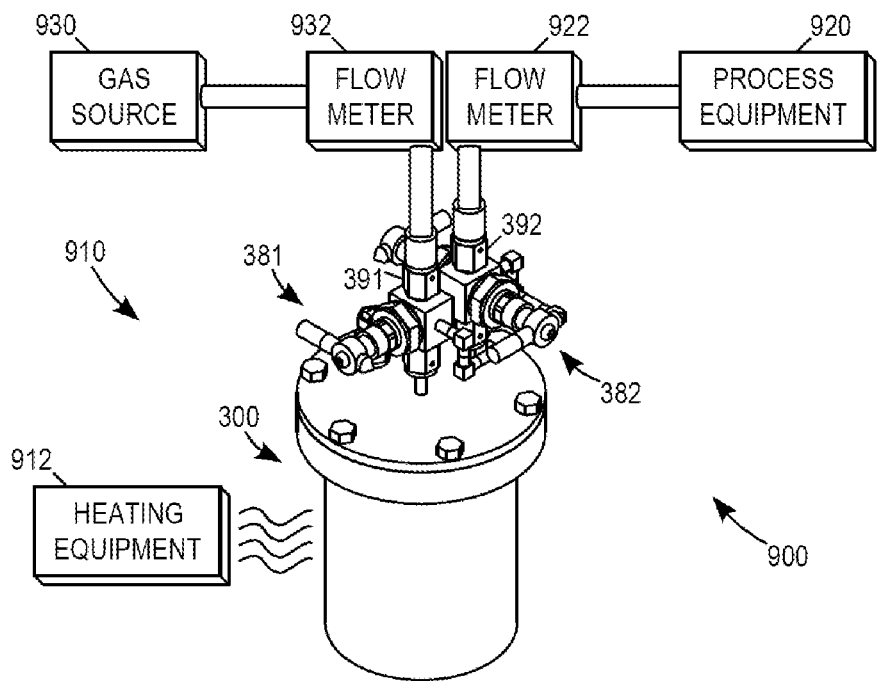
FIG. 9 illustrates, for one or more embodiments, a system using the vaporizer container of FIG. 3.

FIG. 9 illustrates, for one or more embodiments, a system 900 comprising a vaporizer 910, process equipment 920, and a gas source 930. Vaporizer 910, process equipment 920, and gas source 930 generally correspond to vaporizer 110, process equipment 120, and gas source 130, respectively, of FIG. 1. Vaporizer 910 may comprise container 300 and heating equipment 912 to help vaporize material in container 300. Container 300 may be coupled to gas source 930 to receive any suitable gas and may be coupled to process equipment 920 to deliver gas resulting from contact of the received gas with vaporized material to process equipment 920.

The container for one or more embodiments may receive gas at any suitable flow rate in one or more interior regions through one or more passages or inlets defined in any suitable manner through any suitable one or more lids covering one or more openings of the container and/or through any suitable one or more walls, such as a sidewall and/or a bottom wall for example, of the container. The container for one or more embodiments may deliver gas resulting from contact of the received gas with vaporized material at any suitable flow rate through one or more passages or outlets defined in any suitable manner through any suitable one or more lids covering one or more openings of the container and/or through any suitable one or more walls, such as a sidewall and/or a bottom wall for example, of the container. A lid for one embodiment may optionally have one or more inlets to receive gas and one or more outlets to deliver gas. For one embodiment, one or more valves may optionally be used to help regulate the introduction of gas into the container. For one embodiment, one or more valves may optionally be used to help regulate the delivery of gas from the container.

The container for one or more embodiments may have any suitable one or more lids that may be of any suitable size and shape, that may be formed using any suitable material, and that may be mounted to cover one or more openings of the container in any suitable manner. For one embodiment, the container may have a collar around at least a portion of an opening to help mount a lid over the opening. A lid for one embodiment may then be secured to the collar using any suitable one or more mechanical fasteners. The container for one embodiment may optionally be grooved around at least a portion of an opening to help position a gasket between the container and a lid mounted over the opening. A lid for one or more embodiments may help secure one or more holders in an interior region by pressing against such holder(s) in the interior region when the lid is secured to the container. For one or more embodiments, additional structure, such as a spacer for example, may optionally be used to help press a lid against such holder(s).

As illustrated in the example embodiment of FIG. 3, container 300 may have a collar around the opening at the top of container 300, and a lid 306 may be positioned over the collar and secured to the collar using screws, such as screw 307 for example. A groove may optionally be defined around the opening at the top of the collar to help position an O-ring 308 between container 300 and lid 306. O-ring 308 may be formed from any suitable material such as, for example, Teflon®, any suitable elastomer, or any suitable metal, such as stainless steel for example. Lid 306 may define through a generally central region of lid 306 an opening through which a passage or inlet defined at least in part by tube 305 may extend into the interior region of container 300. As lid 306 is secured to the collar for container 300, lid 306 may press against O-ring 308 to help seal lid 306 over the collar and may press against a collar around tube 305 to help press lid 306 against holders 360, 350, 340, 330, 320, and 310. An O-ring for holders 360, 350, 340, 330, 320, and 310, such as O-ring 316 of FIG. 5 for example, may then be compressed to help seal holders 360, 350, 340, 330, 320, and 310 against one another and/or against tube 305. A valve 381 having an inlet coupling 391 may be coupled to tube 305 to help regulate the introduction of gas into container 300. Lid 306 may also define an opening through which a passage or outlet defined at least in part by a tube may extend into container 300. A valve 382 having an outlet coupling 392 may be coupled to the tube to help regulate the delivery of gas from the container.

The gas inlet(s) for one embodiment may be coupled to a gas source using any suitable one or more gas delivery lines. For one embodiment, a flow meter may optionally be coupled between one or more gas inlets and the gas source to help monitor and/or control the flow rate of gas introduction into the container. As illustrated in FIG. 9 for one or more embodiments, inlet coupling 391 for valve 381 may be coupled to a flow meter 932 by a gas delivery line, and flow meter 932 may be coupled to gas source 930 by a gas delivery line. Container 300 may receive any suitable gas from gas source 930 at any suitable flow rate. Container 300 for one or more embodiments may receive any suitable gas at a flow rate in the range of, for example, approximately one standard cubic centimeter per minute (sccm) to approximately 500 sccm. Container 300 for one or more embodiments may receive any suitable gas at a flow rate in the range of, for example, approximately one sccm to approximately 1000 sccm.

The gas outlet(s) for one embodiment may be coupled to process equipment, for example, using any suitable one or more gas delivery lines. For one embodiment, a flow meter may optionally be coupled between one or more gas outlets and the process equipment to help monitor and/or control the flow rate of gas delivery from the container. As illustrated in FIG. 9 for one or more embodiments, outlet coupling 392 for valve 382 may be coupled to a flow meter 922 by a gas delivery line, and flow meter 922 may be coupled to process equipment 920 by a gas delivery line.

Gas delivery lines for gas introduction into the container and for gas delivery from the container may be formed using any suitable material. Such gas delivery line(s) for one embodiment may be formed using any suitable material, such as stainless steel for example, to allow for higher temperatures and/or pressures. Such gas delivery line(s) for one embodiment may be formed using a material having a relatively low coefficient of friction, such as a polymer for example, to help allow for relatively high flow velocities.

The container may be heated in any suitable manner to any suitable temperature to help vaporize material in the container as gas flows through the container. The temperature at which the container is to be heated for one or more embodiments may depend, for example, on the material to be vaporized, on the amount of material to be vaporized, on the concentration of the vaporized gas, and/or on the operating conditions of the processing equipment, for example, to which the resulting gas is to be delivered. The temperature for one or more embodiments may be in the range of, for example, approximately 40 degrees Celsius to approximately 300 degrees Celsius.

Any suitable heating equipment may be used to help heat the material to be vaporized in the container and/or to help regulate the temperature in the container. As illustrated in FIG. 9, heating equipment 912 for one or more embodiments may be used to heat container 300. As examples, suitable heating equipment may include, without limitation, a ribbon heater wound around the container, a block heater having a shape covering the container, a strip heater, a radiant heater, a heated enclosure, a circulating fluid heater, a resistant heating system, and/or an inductive heating system.

Heating equipment for one embodiment may be supported by and/or integrated with the container. The container for one embodiment may define and/or have any suitable support structure to help support any suitable heating equipment around, on, and/or in the container in any suitable manner. Such structure may be integral with and/or coupled to the container in any suitable manner. The container for one embodiment may define in any suitable manner one or more cavities of any suitable shape and size in any suitable one or more walls of the container and/or in any suitable one or more lids to help support one or more heater cartridges, for example.

The temperature at any suitable one or more locations around, on, and/or in the container may optionally be monitored for one or more embodiments to help regulate the temperature in the container. Any suitable one or more temperature sensing devices may be supported at any suitable one or more locations around, on, and/or in the container in any suitable manner. As examples, suitable temperature sensing devices may include, without limitation, a thermocouple, a thermistor, and any other suitable temperature sensing junction or device arranged for contacting any suitable thermally conductive surface in the container.

The container for one or more embodiments may be heated in any suitable manner to help better distribute heat to help vaporize material in the container and/or to help reduce, minimize, and/or avoid cooler locations or cold spots in the container where vaporized material and/or gas resulting from contact of introduced gas with vaporized material may condense. For one or more embodiments where solid material is vaporized, reducing, minimizing, and/or avoiding cooler locations or cold spots may help reduce, minimize, and/or avoid forming deposits that could at least partially clog or obstruct any suitable one or more passageways through which gas flow is to be directed.

The container for one or more embodiments may be formed using a heat conductive material to help better distribute heat. For one or more embodiments where one or more holders in a container are formed using a heat conductive material and are defined, positioned, and/or coupled in the container in thermal contact with the container, heating the container helps to heat such holder(s) and therefore helps increase heated surface area in the container to help better distribute heat to vaporize material in the container. Such holder(s) for one or more embodiments may be defined, positioned, and/or coupled in the container in thermal contact with one or more sidewalls of the container. The container for one or more embodiments may be heated from one or more sidewalls. For one or more embodiments where such holder(s) have one or more walls, such as one or more passageway sidewalls for example, and/or supports formed using a heat conductive material, such wall(s) and/or support(s) may also help to increase heated surface area in the container. The container and/or one or more holders for one or more embodiments may be formed with an increased thermal mass to help maintain the heated temperature in the container.

For one or more embodiments where solid material is to be vaporized by sublimation, the vapor pressure of the solid material at a given temperature is the partial pressure of the solid material at its vapor/solid interface where the number of molecules in the vapor condensing on the surface of the solid material is the same as the number of molecules in the solid sublimed from the surface of the solid material over a given time period. This equilibrium is disrupted by removal of molecules in the vapor at the vapor/solid interface due to contact with gas introduced into the container. Because sublimation will occur at a higher rate to restore equilibrium provided sufficient heat is supplied to the surface of the solid material to compensate for the latent heat of sublimation, increasing heated surface area in the container may help increase the rate of vaporization of solid material. For one or more embodiments where vapor from solid material and/or gas resulting from contact of introduced gas with such vaporized material flows against or near such increased heated surface area, such increased heated surface area may also help better reduce, minimize, and/or avoid condensation of the vaporized material and/or the resulting gas.

Any suitable amount of heating power may be used to help vaporize material in the container. The amount of power for vaporization of material in the container may depend on, for example, the chemistry of the material to be vaporized, the chemistry of the gas introduced into the container, and/or the flow rate of the gas resulting from contact of introduced gas with vaporized material. For one or more embodiments, heating power may be made available in such an amount that the amount of heating power absorbed by the resulting gas is a relatively small fraction of the available heating power, helping to maintain the heated temperature in the container. The amount of available heating power for one or more embodiments may be in the range of, for example, approximately 100 watts to approximately 3000 watts.

For one or more embodiments, gas introduced into the container may be preheated in any suitable manner to any suitable temperature to help maintain the heated temperature in the container. Introduced gas may be preheated depending on, for example, how the container is heated, the length of the gas delivery line(s) for gas introduction, and/or the flow rate of introduced gas. Any suitable heating equipment may be used to help preheat introduced gas and/or to help regulate the temperature of introduced gas. For one or more embodiments, any suitable heating equipment may be used to help heat one or more gas delivery lines for gas introduction into the container.

For one or more embodiments where solid material is to be vaporized, gas may optionally be directed to flow through any suitable one or more filters to help prevent any solid material in the gas flow from being delivered from the container. Such filter(s) may be supported in and/or by the container in any suitable manner using any suitable structure. For one embodiment, one or more fits may be positioned at or near an end of one or more interior regions of the container to help filter the gas resulting from contact of introduced gas with vaporized material prior to being delivered from the container. Such frit(s) may be of any suitable size and shape and may be formed using any suitable porous material of any suitable density. As one example, a frit formed using a porous stainless steel having a pore size in the range of approximately 1 micron to approximately 100 microns, for example, may be used for one embodiment.

As illustrated in the example embodiment of FIG. 3, a generally circular frit 370 may be positioned over top holder 360 to help filter solid material from gas flow directed over material supported by holder 360 prior to delivery through the outlet defined through lid 306. Frit 370 may define through a generally central region of frit 370 a generally circular opening through which tube 305 may extend. Frit 370 for embodiment may be pressed over holder 360 in any suitable manner using any suitable structure as lid 306 is secured to container 300 to help seal frit 370 over holder 360. The example embodiment of FIG. 3 for one embodiment may comprise in addition to or in lieu of frit 370 a frit positioned in the passage or outlet for gas delivery from container 300 and/or one or more fits positioned in one or more passageways through one or more of holders 310, 320, 330, 340, 350, and 360.

For one or more embodiments, one or more gas delivery lines for gas delivery from the container to processing equipment, for example, may be heated in any suitable manner to any suitable temperature to help reduce, minimize, and/or avoid condensation of the resulting gas in such line(s). One or more gas delivery lines for one embodiment may be heated, for example, to a temperature approximately 5-10 degrees Celsius hotter than that of the container. Any suitable heating equipment may be used to help heat one or more gas delivery lines for gas delivery from the container.

For one or more embodiments where gas is introduced at or near a first end of an interior region of a container and directed to flow toward a second end of the interior region, material supported toward the first end may be removed by introduced gas at a faster rate relative to material supported toward the second end. For one or more embodiments where a carrier gas is introduced into the container, the carrier gas may become mostly or fully saturated with vaporized material prior to reaching vaporized material at or near the second end. For one or more embodiments where a gas is introduced into the container to react with vaporized material, introduced gas may react with vaporized material prior to reaching vaporized material at or near the second end. For one or more embodiments, more material may be supported toward the first end and less material may be supported toward the second end to help compensate for such disproportionate removal of vaporized material. For one or more embodiments where a plurality of holders are used to help support material in an interior region of a container, two or more of such holders may optionally be sized and/or spaced to help support more material toward the first end and less material toward the second end to help compensate for such disproportionate removal of vaporized material. For one or more embodiments where such holders have one or more sidewalls, for example, two or more of such holders may have sidewall(s) of a different height.

For one or more embodiments, any suitable equipment may be used to help identify when the container, any suitable one or more holders, and/or a bottom surface of an interior region of the container are empty or near empty of material to be vaporized. For one or more embodiments, such equipment may be used to help identify when a bottom holder and/or a top holder in an interior region of the container are empty or near empty of material to be vaporized. For one or more embodiments, such equipment may be used to help identify when a bottom surface of an interior region of the container and/or a top holder in the interior region are empty or near empty of material to be vaporized.

For one or more embodiments, any suitable level sensor may be used to help identify when a holder or a bottom surface of an interior region is empty or near empty of material to be vaporized in any suitable manner and to signal such identification in any suitable manner. An optical or infrared level sensor, for example, may be used to direct radiation toward a reflective support surface over which material to be vaporized is supported and to detect the reflection of such radiation when material has been removed from the reflective support surface. As other examples, an ultrasonic level sensor, a capacitive level sensor, and/or a rocker switch may be used to help identify when a holder or a bottom surface of an interior region is empty or near empty of material to be vaporized. As yet another example, an optical or infrared sensor, for example, may be used to direct radiation through space over material being vaporized and to detect such radiation to help monitor the concentration of vaporized material in such space.

For one or more embodiments, the container may have one or more sight glasses through which one or more optical and/or infrared sensors may direct radiation into the container and/or detect radiation from the container to help identify when a holder or a bottom surface of an interior region is empty or near empty of material to be vaporized. The container for one or more embodiments may have one or more sight glasses to help allow an operator to identify visually when a holder or a bottom surface of an interior region is empty or near empty of material to be vaporized.

The container for one or more embodiments may optionally be configured with one or more bypass passages and/or one or more additional container inlets and/or outlets to help purge any solid deposits and/or contaminants, for example, from one or more container inlets, one or more container outlets, and/or one or more interior regions of the container. As illustrated in the example embodiment of FIG. 3, a bypass passage defined by tubing 395 coupled between valves 381 and 382 may be used to help purge valves 381 and 382, inlet coupling 391, and/or outlet coupling 392. A valve 383 may optionally be coupled to tubing 395 to help regulate fluid flow through the bypass passage. An inlet/outlet coupling 397 may optionally be used to help define an additional inlet/outlet for the interior region of container 300 to help purge the interior region.

Although described in connection with receiving a gas for contact with vaporized material, vaporizer 110 for one or more alternative embodiments may not receive any gas but rather may be used as a vapor draw where any suitable material may be vaporized in a container and delivered to process equipment 120, for example, without being carried by or reacting with any gas. Vaporizer 110 for one or more of such embodiment(s) may support material to be vaporized to help increase exposed surface area of material to be vaporized to help promote vaporization of material.

While the invention has been has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

What is claimed is:

1. A vapor delivery vessel for vaporizing and delivering vaporized source material, the vessel comprising:
 a peripheral vessel wall bounding an interior volume;
 a gas inlet and a gas outlet arranged in at least intermittent fluid communication with the interior volume, the gas inlet being adapted to supply a first gas to the interior volume; and
 at least one support surface disposed within the interior volume and adapted to support vaporizable source material in or along a flow path of said first gas within the interior volume, wherein the at least one support surface is partitioned with walls each extending upward from the at least one support surface to define a plurality of discrete support surface portions each arranged to support vaporizable material.

2. The vapor delivery vessel of claim 1, wherein the vessel has associated therewith at least one bypass passage, bypass inlet, or bypass outlet adapted to permit solid deposits or contaminants to be purged from the vessel or any conduit in fluid communication therewith.

3. The vapor delivery vessel of claim 1, wherein the vaporizable material comprises a solid.

4. The vapor delivery vessel of claim 3, wherein the solid vaporizable material comprises any of powder, agglomerated particles, and crystalline form.

5. The vapor delivery vessel of claim 4, wherein the solid vaporizable material comprises a film deposited on said at least one support surface.

6. The vapor delivery vessel of claim 1, wherein the vaporizable material comprises a liquid.

7. The vapor delivery vessel of claim 1, wherein the vaporizable material comprises a plurality of compositionally different vaporizable materials.

8. The vapor delivery vessel of claim 7, wherein at least two materials of said plurality of vaporizable materials are spatially segregated into distinct zones or regions of the interior volume.

9. The vapor delivery vessel of claim 1, further comprising at least one internal gas carrying member disposed within the interior volume and communicatively coupled to the gas inlet.

10. The vapor delivery vessel of claim 9, wherein said at least one internal gas carrying member extends through said at least one support surface.

11. The vapor delivery vessel of claim 9, wherein said internal gas carrying member comprises a threaded or press-fit portion insertable into an aperture defined in said at least one support surface.

12. The vapor delivery vessel of claim 1, further comprising structure disposed within the interior volume adapted to increase contact time of said first gas with said vaporizable source material, said structure comprising at least one vaporizable material support surface defining a plurality of passageways adapted to permit gas flow therethrough.

13. The vapor delivery vessel of claim 12, wherein said at least one support surface comprises a plurality of support surfaces defined by a plurality of holders including a plurality of passageways adapted to permit gas flow therethrough, wherein passageways defined in adjacent holders are unaligned.

14. The vapor delivery vessel of claim 1, wherein said at least one support surface is defined by at least one holder arranged within said vessel.

15. The vapor delivery vessel of claim 1, wherein said gas inlet and said gas outlet are arranged along a first end of said vessel.

16. The vapor delivery vessel of claim 1, further comprising a plurality of gas distribution passages adapted to direct the first gas within the interior volume.

17. The vapor delivery vessel of claim 1, wherein the at least one support surface is defined by a plurality of different support structures adapted for placement at different levels within the interior volume, and at least one support structure includes an upwardly extending sidewall and a plurality of upwardly-extending protuberances, wherein said sidewall is taller than each of said protuberances.

18. The vapor delivery vessel of claim 1 comprising at least one associated heating element.

19. The vapor delivery vessel of claim 18, wherein said at least one heating element is disposed around, in, or on said vessel.

20. The vapor delivery vessel of claim 1, wherein said at least one support surface is gas-permeable.

21. The vapor delivery vessel of claim 1, wherein said at least one support surface comprises any of a mesh and a metallic wool.

22. The vapor delivery vessel of claim 1, wherein said at least one support surface is defined in a holder that is removable from said vessel.

23. The vapor delivery vessel of claim 1, further comprising at least one gas flow meter communicatively coupled with any of said gas inlet and said gas outlet.

24. A method for delivering vaporized source material, comprising:
supplying a first gas to the gas inlet of the vapor delivery vessel of claim 1, said vapor delivery vessel including therein said vaporizable material;
heating the vessel to vaporize at least a portion of the vaporizable material;
receiving a second gas from the gas outlet, said second gas comprising said first gas and said vaporized source material.

25. The method of claim 24, further comprising preheating said first gas prior to or during said supplying step.

26. The method of claim 24, further comprising the step of metering any of the first gas and the second gas.

27. The method of claim 24, further comprising the step of monitoring a temperature on or within any portion of the vessel, and applying heat to the vessel responsive to the monitoring step.

28. The method of claim 24, further comprising the step of depositing the vaporized source material using a deposition process selected from the group consisting of chemical vapor deposition, atomic layer deposition, plasma enhanced atomic layer deposition, metal organic chemical vapor deposition, plasma enhanced chemical vapor deposition, and ion implantation.

29. The method of claim 24, wherein the vaporizable source material comprises at least one of boron (B), phosphorous (P), copper (Cu), gallium (Ga), arsenic (As), ruthenium (Ru), indium (In), antimony (Sb), lanthanum (La), tantalum (Ta), iridium (Ir), decaborane ($B_{10}H_{14}$), hafnium tetrachloride ($HfCl_4$), zirconium tetrachloride ($ZrCl_4$), indium trichloride ($InCl_3$), a metal organic β-diketonate complex, cyclopentadienyl cycloheptatrienyl titanium (Cp-TiChT), aluminum trichloride ($AlCl_3$), titanium iodide ($Ti_xI_y$), cyclooctatetraene cyclopentadienyl titanium ((Cot)(Cp)Ti), bis(cyclopentadienyl)titanium diazide, tungsten carbonyl ($W_x(CO)_y$), bis(cyclopentadienyl)ruthenium (II) ($Ru(Cp)_2$), and ruthenium trichloride ($RuCl_3$).

30. The method of claim 24, further comprising the step of contacting a semiconductor substrate with the vaporized material to form a film on the semiconductor substrate.

31. The method of claim 30, further comprising the step of processing the semiconductor substrate comprising the film to form a semiconductor.

* * * * *